US010416230B2

(12) United States Patent
Thurmaier

(10) Patent No.: US 10,416,230 B2
(45) Date of Patent: Sep. 17, 2019

(54) ALIGNING DEVICE AND HANDLING DEVICE

(71) Applicant: Turbodynamics GmbH, Riedering (DE)

(72) Inventor: Stefan Thurmaier, Au/Bad Feilnbach (DE)

(73) Assignee: Turbodynamics GmbH, Riedering (DE)

( * ) Notice: Subject to any disclaimer, the term of this patent is extended or adjusted under 35 U.S.C. 154(b) by 543 days.

(21) Appl. No.: 14/913,001

(22) PCT Filed: Aug. 21, 2014

(86) PCT No.: PCT/EP2014/067867
§ 371 (c)(1),
(2) Date: Feb. 19, 2016

(87) PCT Pub. No.: WO2015/025024
PCT Pub. Date: Feb. 26, 2015

(65) Prior Publication Data
US 2016/0202311 A1    Jul. 14, 2016

(30) Foreign Application Priority Data
Aug. 21, 2013  (DE) ........................ 10 2013 109 055

(51) Int. Cl.
*G01R 1/04* (2006.01)
*G01R 31/28* (2006.01)
(52) U.S. Cl.
CPC ..... *G01R 31/2893* (2013.01); *G01R 31/2867* (2013.01); *G01R 31/2886* (2013.01); *G01R 31/2889* (2013.01)

(58) Field of Classification Search
CPC ............ G01R 31/2893; G01R 31/2891; G01R 1/0408; G01R 1/04; G01R 31/2601; G01R 31/2887; G01R 31/2889; G01R 1/06705; G01R 31/2884; G01R 31/3025; G01R 31/307; G01R 31/318511
USPC .... 324/750.25, 750.22, 750.19, 261, 754.08, 324/756.01, 755
See application file for complete search history.

(56) References Cited

U.S. PATENT DOCUMENTS

| 4,742,980 | A | 5/1988 | Heigl |
| 6,271,658 | B1 * | 8/2001 | Vallinan ............. G01R 31/2851 |
| | | | 324/750.25 |
| 6,717,432 | B2 | 4/2004 | Chiu et al. |
| 8,035,406 | B2 | 10/2011 | Mueller |
| 2002/0050042 | A1 * | 5/2002 | Orsillo ............... G01R 31/2887 |
| | | | 29/401.1 |

(Continued)

FOREIGN PATENT DOCUMENTS

| DE | 4007011 A1 | 9/1991 |
| DE | 10016530 C1 | 10/2001 |

(Continued)

*Primary Examiner* — Jermele M Hollington
*Assistant Examiner* — Taqi R Nasir
(74) *Attorney, Agent, or Firm* — Rankin, Hill & Clark LLP

(57) ABSTRACT

The present invention relates to an aligning device and handling device, and in particular to an aligning device for the positionally accurate coupling of a handling device for exchanging an interface unit to another device for receiving at least one interface unit and to a handling device for exchanging an interface unit.

24 Claims, 22 Drawing Sheets

(56) References Cited

U.S. PATENT DOCUMENTS

Figure 3:
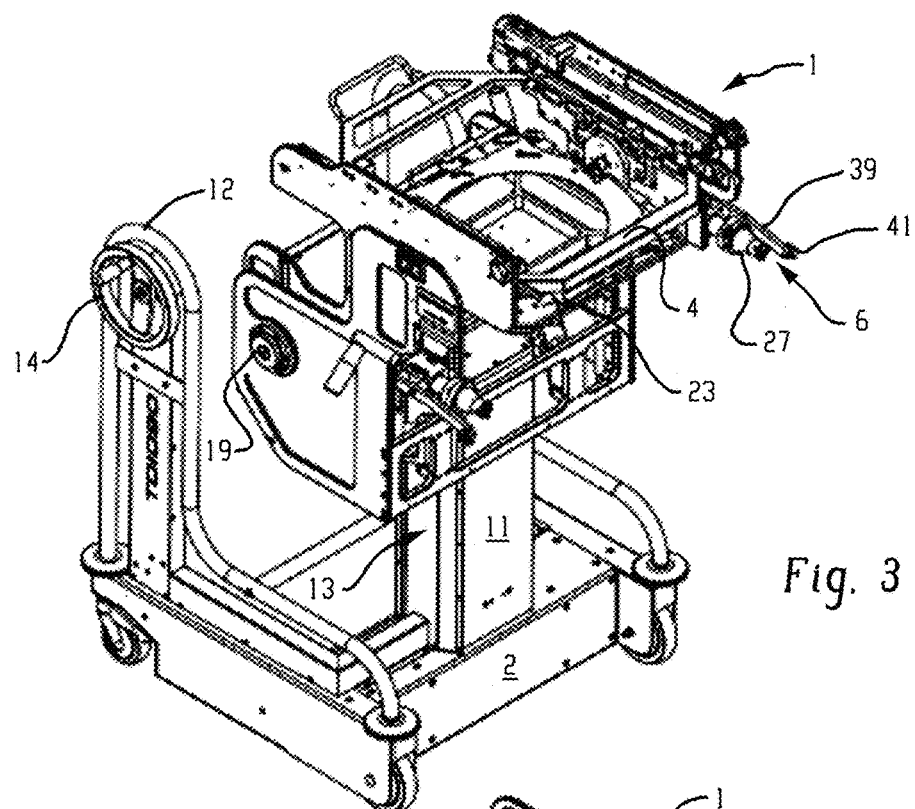

| | | | |
|---|---|---|---|
| 2002/0145438 A1* | 10/2002 | Ramesh | G01R 1/0433 |
| | | | 324/750.19 |
| 2003/0102857 A1* | 6/2003 | Hirschmann | G01R 31/2887 |
| | | | 324/750.02 |
| 2003/0122536 A1* | 7/2003 | bin Mohamed Hassan | ................ |
| | | | G01R 31/2887 |
| | | | 324/750.22 |
| 2003/0217477 A1 | 11/2003 | Thurmaier | |
| 2004/0031164 A1* | 2/2004 | Sevastian | G01B 3/50 |
| | | | 33/501.45 |
| 2005/0073296 A1* | 4/2005 | Mueller | G01R 31/2887 |
| | | | 324/750.19 |
| 2006/0155396 A1 | 7/2006 | Jeserer | |
| 2006/0255820 A1 | 11/2006 | Ramamoorthi | |
| 2006/0272901 A1 | 12/2006 | Heigl | |
| 2007/0030018 A1 | 2/2007 | Thurmaier | |
| 2008/0219814 A1 | 9/2008 | Heigl | |
| 2009/0102457 A1 | 4/2009 | Vayner | |
| 2010/0264907 A1* | 10/2010 | Mueller | G01R 31/2887 |
| | | | 324/750.3 |

FOREIGN PATENT DOCUMENTS

| | | |
|---|---|---|
| DE | 10132489 A1 | 4/2003 |
| DE | 10245865 A1 | 4/2004 |
| DE | 102004026031 B3 | 8/2005 |
| DE | 202004021182 U1 | 2/2007 |
| DE | 102005048237 B3 | 3/2007 |
| EP | 1947466 A1 | 7/2008 |

\* cited by examiner

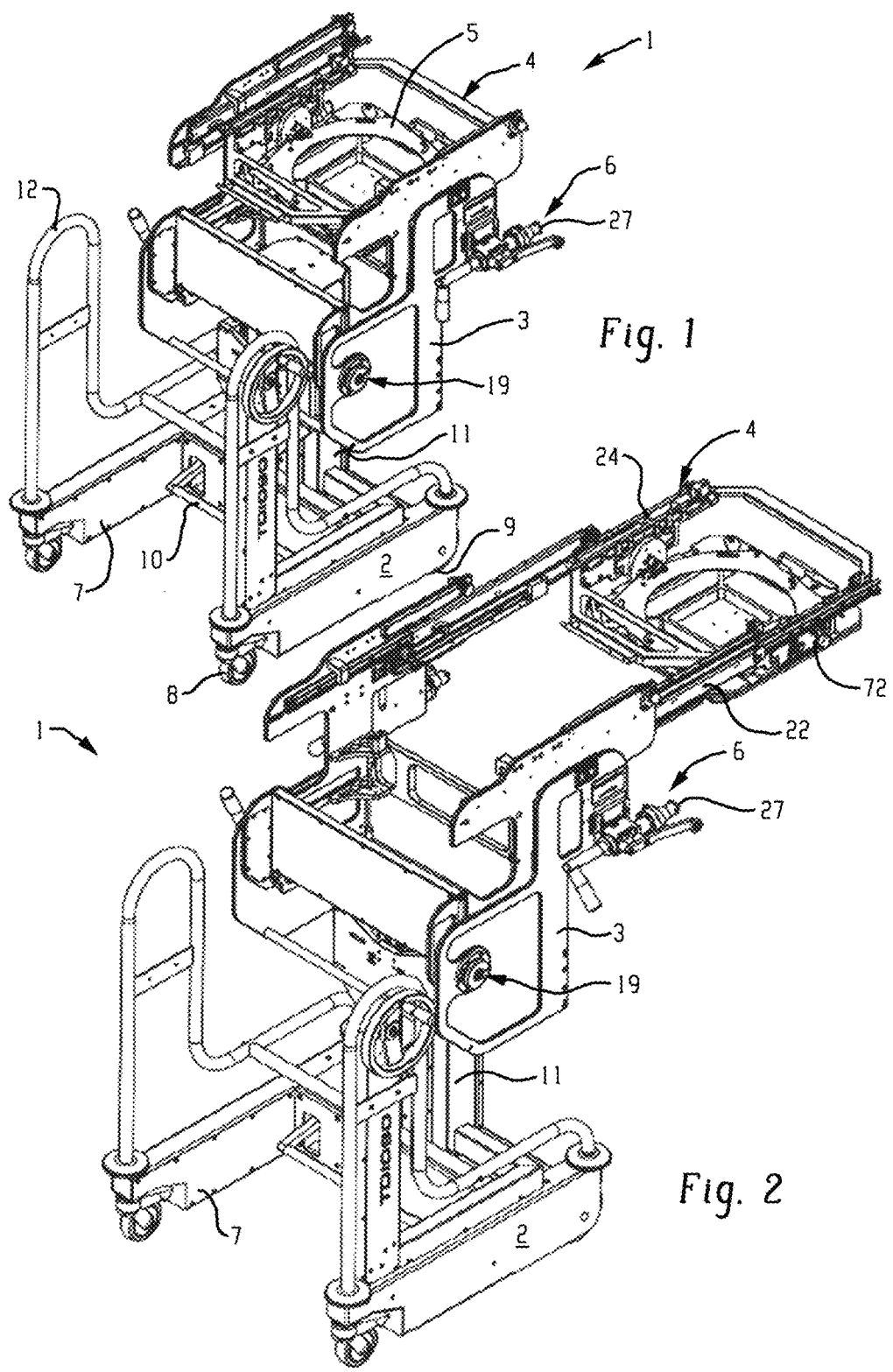

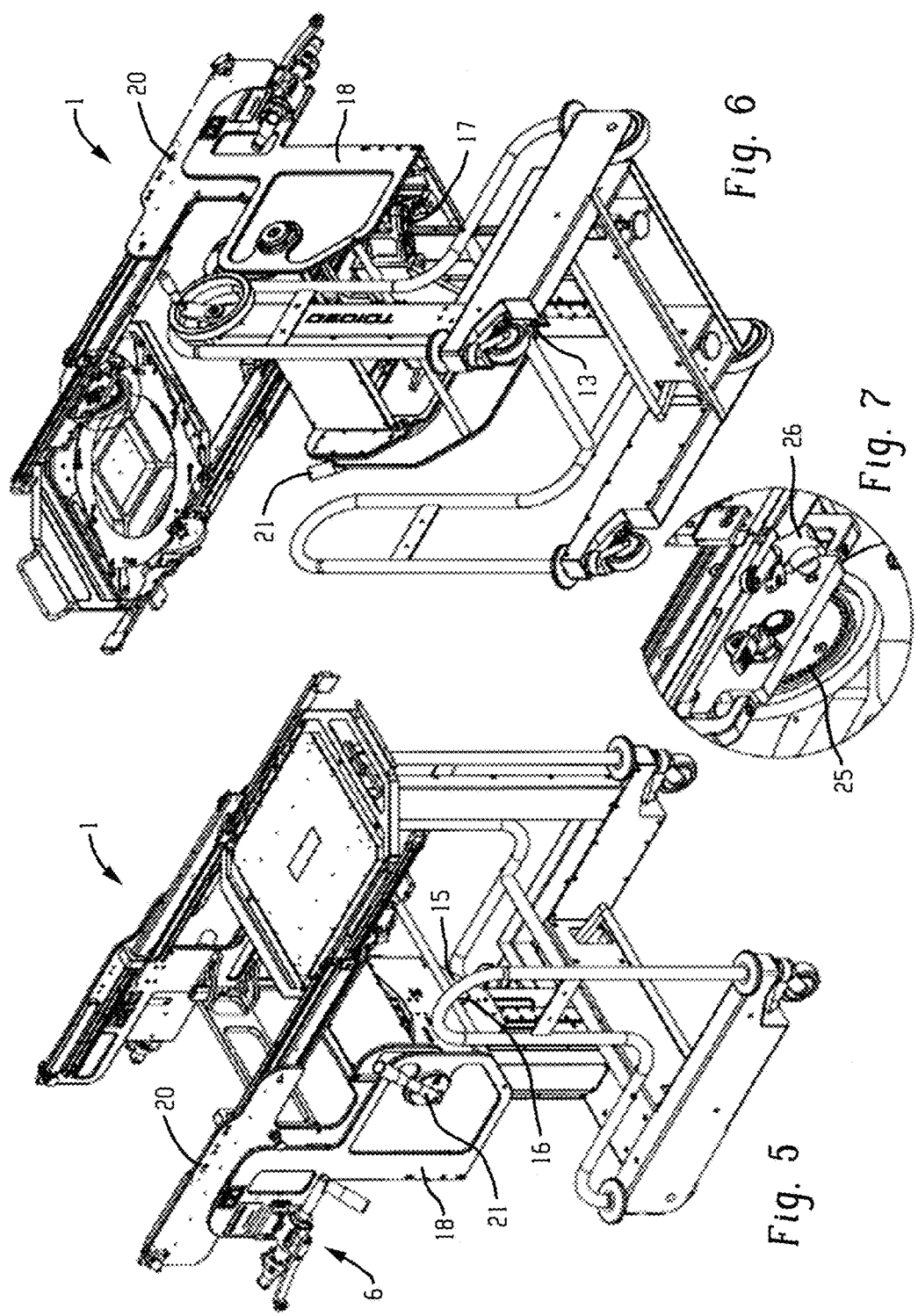

DETAIL Y

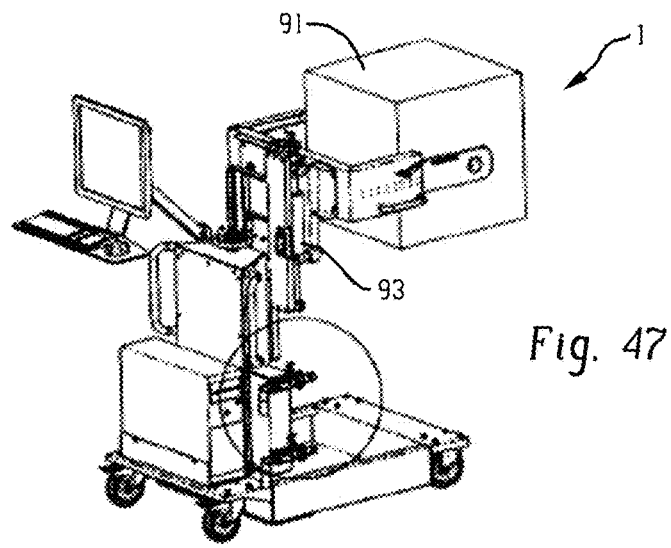
Fig. 47
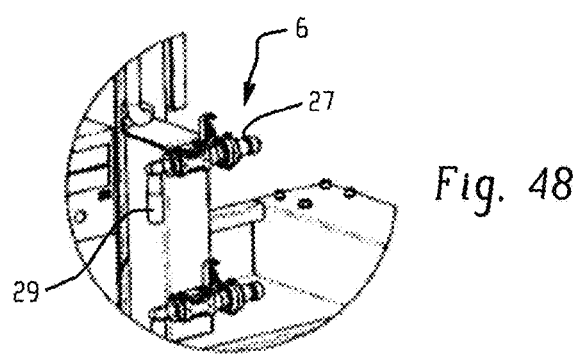
Fig. 48
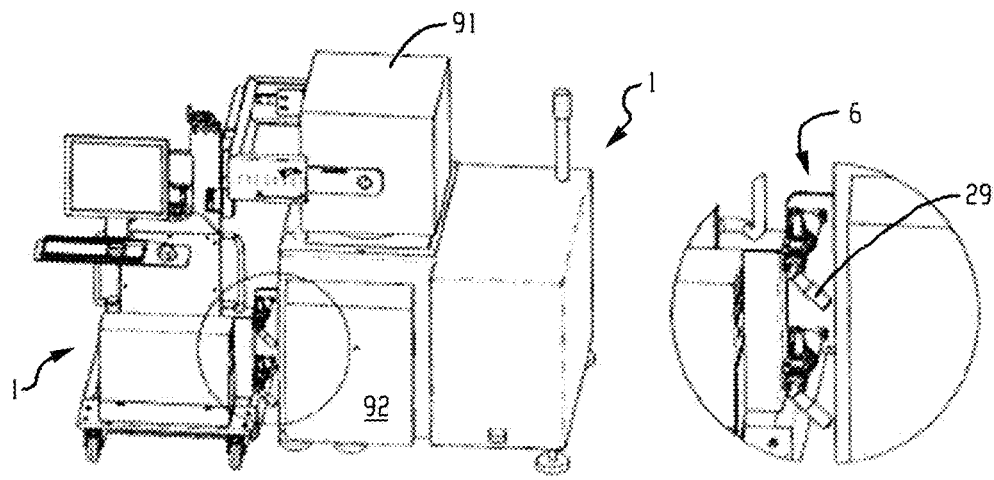
Fig. 49
Fig. 50

ALIGNING DEVICE AND HANDLING DEVICE

The present invention relates to an aligning device and handling device.

Testing systems for testing semiconductor elements generally include a testing device ("tester") and a supplying device ("handler" or "prober"). Such testing systems can be used to test electronic components such as integrated circuits (which are tested with handlers) or wafers (which are tested with probers) for proper functioning.

In addition, a testing system (test cell) has an interface unit (board), which is generally composed of an adaptor plate, which is situated in a stiffening frame. The adaptor plate has a number of contact elements, which are provided specifically for one type of semi-conductor element, which are used to contact the semiconductor elements that are to be tested.

The interface unit is located in the region of the interface between the testing device and the supplying device. The contact elements are respectively arranged in a pattern specific to the semiconductor elements that are to be tested in order to be able to correctly contact the contact points of the semiconductor elements. Depending on the testing system, the interface unit is detachably fastened either to the testing device or to the supplying device so that the interface unit is replaceable in order to be able to test various semiconductor components.

A variety of designs of interface units are known in professional circles. The interface units are also referred to as load boards or probe cards.

The supplying device includes elements with which the semiconductor elements that are to be tested are supplied to a testing device.

In the following, the testing device (test head) or the supplying device (handler, prober machine, wafer-probing machine, wafer prober) are each referred to by the term "testing device." Both types of testing devices can be designed to receive an interface unit.

For purposes of positioning interface units, it is known to use drawer and hinge mechanisms that are fastened to testing devices. Examples for testing systems that use such drawer and hinge mechanisms are briefly described in the following.

A testing apparatus for testing semiconductor components is known from JP 9 159 730 A in which a performance board is coupled to a test head in such a way that it can be pulled out from the test head laterally like a drawer. The performance board has guide holes through which guide pins of the test head extend in order to position the latter. By pulling it out laterally, it is possible to easily exchange the performance board.

Another testing apparatus for testing semiconductor components is known from EP 1 495 339 B1 and US 2003/019 4821 A1 in which a sub-assembly supporting an interface unit) is fastened to the testing system in pivoting fashion. The pivoting arrangement of the sub-assembly allows the interface unit to be simply removed from the testing system and exchanged. Preferably, the sub-assembly is provided with a telescope-like pull-out device with which the interface unit can be pulled out from the region of the testing systems.

PCT/EP2013/059151, which has not yet been published, discloses a module for exchanging an approximately planar interface unit in a testing system for testing semiconductor elements. The module includes a base element, a holder, and guide elements. The guide elements are embodied so that the interface unit can be moved by means of a linear, translatory movement from an end position into an intermediate position and from the intermediate position into a removal position, which is situated outside of the testing systems. The mechanism includes a lever mechanism, which is controlled by a link, which is supported so that it is able to move transversely to the linear, translatory movement of the holder.

Devices of this kind are also known from U.S. Pat. Nos. 6,107,813, 5,528,158, 5,471,148, and 4,721,198.

Interface unit-changing systems in testing devices are thus generally known in the form of an integrated solution. With these systems, the interface units are extended out from the testing devices in a semiautomatic fashion in order for them to be exchanged. They are extended out from the testing device by the opening of flaps or doors. In so doing, the delicate interface units must be removed from and inserted into the drawer mechanisms manually by one or even two users.

Testing systems in general are described, for example, in JP 9159730 A, EP 1 495 339 B1, DE 102 05 115 B4, and DE 197 52 229 A1.

There are also devices known from the prior art for positioning a testing device (tester, handler, prober) in relation to another testing device. Devices of this kind are referred to as manipulators or handling devices.

For example, the following handling devices are known.

DE 40 07 011 C2 has disclosed a handling device that has a vertically oriented guide column in a rectangular housing with a slot on the side and expander feet for placing it on the floor. In this case, an adjusting device in the form a guide carriage is mounted in a vertically movable fashion and has a support that can be pivoted around a vertical axis, can freely pivot in a horizontal plane, and can be moved axially and both the height and the horizontal adjustments can be immobilized by means of clamps. A test head holder is also provided. The support has a torque support that is connected to the guide column in a clampable fashion so that a vertical fine adjustment by means of an additional gear mechanism and a hand crank. In particular, counterweights are arranged in a pulley arrangement, which are operatively connected by means of a loose wheel to the support so that the counterweights become smaller due to the pulley principle.

DE 35 24 348 C2 has disclosed a device for positioning test heads. This includes a test head socket that is connected by means of a hinge connection in a vertically adjustable to a support column that is erected on an expander support so that the test head socket is able to move in a plane. The test head socket is able to pivot around a horizontal tilting axis at the free end of a pair of articulating arm pairs that are situated symmetrical to a plane extending through the center axis of the support column.

DE 101 32 489 B4 has disclosed a handling device, in particular for positioning a test head on a testing device. This includes a holder for a test head and a column on which positioning means connected to the holder are arranged in a vertically adjustable fashion. The positioning means have at least one pair of articulating arms that are linked at their one end to the holder in a manner that allows them to pivot around a vertical axis. At their other end, the articulating arms are each linked to a carriage that can be moved in the horizontal direction; the carriages are arranged on the column so that they can move independently of each other.

In order to connect an interface unit or the stiffening frame in which the interface unit is situated to a testing device, frequently a connecting device with locking lugs and corresponding locking units is provided. This connecting device is also referred to as a docking device and is used on the one hand to achieve an exact alignment of the interface unit with regard to the testing device and on the other, to mechanically fix the interface unit to the testing device.

The alignment of the interface unit must therefore take place in such a way that locking lugs can be inserted into corresponding locking units. In order to do so, the contact surfaces of an interface unit and a testing device must be positioned spaced slightly apart from one another and aligned parallel with one another so that all of the locking lugs of the docking device can engage in the corresponding openings. In particular, care must be taken not to damage the delicate contact elements that protrude slightly from the interface unit. As a result, connecting the interface unit and testing device requires a lot of work.

With the drawer and pivot mechanisms known from the prior art, an interface unit must be inserted into the mechanism manually, i.e. by a user. This consistently causes damage to the contact elements.

In addition, interface units have a relatively high dead weight of up to 100 kg and require extremely delicate handling due to their contact elements (generally spring contact pins). In addition, the interface units are expensive since they must be produced individually. They have to be regularly exchanged in order to be able to test different types of specimens with a testing system.

Up to now, the exchanging an interface unit in a testing system was carried out in that first, a testing device, e.g. a test head, together with the interface unit had to be removed. To do so, the testing device was either pivoted upward in the vertical direction or was pivoted all the way out to the side so that the interface unit could be replaced. Because interface units are becoming larger and larger, it is most often no longer possible for them to be inserted or changed by one user alone, instead requiring two people. During manual insertion of the interface unit, there is the danger of it not being correctly positioned and thus getting damaged.

Positioning an interface unit precisely in relation to the testing device is thus very labor-intensive and generally requires two operators. In this case, one must take into consideration the fact that often, locking lugs also have to be accommodated almost without play in corresponding openings or locking units. But this means that an interface unit and a testing device must be arranged precisely in relation to each other in their position and in their linear alignment.

The object of the present invention, therefore, is to create an aligning device and handling device by means of which an interface unit can be positioned in relation to a testing device, easily supplied, and also simply removed and functions safely and reliably without damage to the interface unit and in particular its contact elements.

In order to attain this object, the invention has the features disclosed in claims 1 and 5. Advantageous embodiments thereof are disclosed in the claims that are dependent on them.

According to the invention, an aligning device is provided for the positionally accurate coupling of a handling device for exchanging an interface unit to another device for receiving at least one interface unit. The aligning device is designed in accordance with the plug and socket principle. It includes at least one plug-like centering element, which has a mating section, and a socket element embodied in accordance with the centering element for receiving the centering element. The aligning device is embodied in such a way that when the centering element is in the socket element, a positionally accurate coupling of the handling device to another device for receiving at least one interface unit is assured and the centering element can be affixed to one of the two devices and the socket element can be correspondingly affixed to the other device.

The aligning device permits a docking of a handling device for exchanging an interface unit to another device for receiving at least one interface unit. In the docking process, the handling device and thus an interface unit contained therein are aligned in relation to a testing device and the handling device is immobilized and locked to the testing device so that an interface unit can be exactly positioned and also exchanged.

With the handling device, which is provided with an aligning device, it is possible to position an interface unit in relation to a testing device, to supply it to the testing device in a safe and reliable fashion, and to remove it from the testing device.

With the aligning device according to the invention, a means has now been provided for docking a handling device to a testing device or to a device for receiving at least one interface unit. By means of the aligning device, a handling device, which receives the interface unit, and a testing device can be connected and locked to each other and aligned with each other in space so that after the docking, the locking lugs of an interface unit are positioned in a precise, positionally accurate, and preferably almost play-free fashion in relation to the corresponding openings in a testing device, both in their position and in their linear alignment and direction.

In particular, this avoids the danger of the extremely delicate contact elements (generally spring contact pins) of an interface unit being damaged since an interface unit is exactly aligned in relation to a testing device and affixed to it so that an interface unit can be transferred to or received by a testing device in an extremely safe and reliable fashion.

With the testing device according to the invention, users that have test systems without changing systems (drawer or hinge mechanisms), can retrofit their existing devices, i.e. provide them with the aligning device. Consequently, aligning devices can be upgraded to permit an exact positioning of the interface unit in relation to the testing device.

The mating section can be embodied in the form of a conical or cylindrical section.

The aligning device can have two centering elements and two socket elements.

On the centering element or on the socket element, a tension element can be provided, which makes it possible to pull the centering element and the socket element together. By means of a tension element of this kind, a centering element and a socket element can be brought into engagement with each other in a positionally accurate, play-free way.

The tension element can be embodied so that through rotation of the tension element, a detent lug of the tension element is guided along a detent lug opening extending obliquely to the longitudinal direction of the centering element and preferably in an end position, positions the centering element entirely in the socket element.

The tension element makes it possible to pull the centering element and socket element completely against each other. In addition, the tension element ensures a detent engagement of the centering element with the socket element, which produces a play-free, positionally accurate connection between the centering element and the socket element.

A handling device for exchanging an interface unit is also provided according to the invention. The handling device includes a chassis, a handling unit positioned on the chassis so that it can be moved at least in the vertical Z direction, the handling unit having a receiving device, which can be retracted and extended in a linear fashion, for receiving the interface unit. The handling unit has an aligning device for the positionally accurate coupling of the handling unit to another device for receiving at least one interface unit.

The receiving device for receiving the interface unit preferably has gripper elements, which can engage in corresponding recesses or undercuts in the interface unit in order to thus affix the interface unit to the receiving device. In a simplified embodiment, the receiving device can be embodied by means of four screws, for example, which are screwed into the interface unit.

In the context of the present invention, a "device for receiving an interface unit" is understood to be a testing device, e.g. a tester, a prober, a handler, or a receiving device, for example an exchanging table or a shelf for receiving one or more interface units.

With the handling device according to the invention, it is only necessary to move a testing device of a testing system vertically upward by a short distance. The handling device is then first docked to the testing device by means of the aligning device and then enables an exact positioning and a simple removal and insertion of an interface unit.

The handling device according to the invention for exchanging an interface unit enables a positionally accurate changing of interface units and provides a variable and system-independent solution for exchanging, transporting, and in particular safe, positionally accurate insertion and removal of an interface unit into and out of a testing device.

By means of the aligning device, the handling device for exchanging an interface unit can be coupled or docked in a positionally accurate and play-free fashion to another device for receiving at least one interface unit in a positionally accurate and play-free fashion.

With the handling device it is thus possible to move an interface unit is moved up against a device for receiving an interface unit, for example a testing device, in order to ensure an exact, precise docking of the handling device to the testing device, in order to then position an interface unit safely and precisely in relation to a testing device and to remove or insert it.

The handling device according to the invention enables a precise and smooth movement in space of the handling unit with the drawer mechanism. In addition, the handling device ensures that no damage to the interface unit accommodated therein occurs during transport.

With a handling device according to the invention, it is in practice possible to operate approximately 25 testing systems.

The linearly retractable and extendable receiving device can have a locking device so that it can be locked in certain positions.

The handling device is also embodied as extremely compact and can thus be used in optimal fashion in the vicinity of testing systems that are generally used in clean rooms.

In addition, the movements of the interface unit that are executed by the handling device can be carried out in an extremely smooth fashion and can be reproduced exactly.

By contrast with the prior art, the handling unit of the handling device can be docked and connected to another device in a positionally accurate and play-free fashion by means of the aligning device.

Furthermore, the handling device can have a lift mechanism for raising and lowering the receiving device, which is linearly extendable and retractable in the horizontal direction, in the Z direction, which lift mechanism can preferably be lowered and raised by a predetermined height so that in an end position, it assumes a predetermined position for receiving and lowering.

The predetermined position refers to a position in which the receiving device is positioned in relation to the interface unit, particularly a very small distance away from it, so that it is not loaded by the weight of the receiving device or damaged due to contact with the receiving device.

The lift mechanism can be actuated by a swiveling lever in such a way that a movement of the receiving device by a predetermined stroke occurs. This virtually rules out the possibility of damage to the interface unit by the user since the stroke is predetermined. In this way, the contact surfaces of the interface unit are protected from damage since the receiving device is not contacted by the interface unit through improper use of the receiving device.

In addition, a sliding device for lifting and lowering the handling unit in the Z direction is provided in order to execute a vertical preadjustment of the handling unit in relation to a device for receiving an interface unit, in the course of which the centering element can be inserted into the socket element.

The sliding device is thus used to carry out a preadjustment of the handling device to different devices for receiving an interface unit.

The handling unit can be connected to the chassis by means of a hinge mechanism, which permits a relative movement of the handling unit in a horizontal plane, the hinge mechanism is preferably equipped with torsion springs. These hold the handling unit in a starting position in relation to the chassis.

The hinge mechanism permits the handling unit to execute a relative movement in a horizontal plane. The relative movement in the horizontal plane facilitates the positionally accurate, play-free docking by means of the aligning device since a smaller offset of the chassis in relation to the socket element and centering element in the horizontal plane is compensated for so that the handling unit is positioned exactly.

The handling unit can be supported in a resilient fashion in relation to the chassis in the Z direction in order to compensate for a vertical offset between the receiving device and the interface unit.

This resilient support likewise makes it possible to compensate for a certain offset in the Z direction between the handling unit and another device for receiving at least one interface unit.

The receiving device can have a receiving unit for affixing the interface unit, which is connected to the receiving device by means of rubber elements. This likewise results in the fact that positioning inaccuracies can be compensated for.

It is possible for an interface unit to be affixed to the bottom of the receiving device for receiving the interface unit. The interface unit can also be affixed to the top of the receiving device.

The frame and the receiving device connected to it in the drawer mechanism can be supported so that they can rotate around a horizontal axis. This enables a rotation of the receiving device by 180°. This rotated position is referred to as the service position since a worker can easily check the functionality of an interface unit situated in the receiving device.

The hinge mechanism and/or the resilient support and/or the rotatable support and/or the receiving device that can be linearly extended and retracted in the horizontal direction and/or the sliding device and/or the lift mechanism can have an interlocking device that can inhibit the corresponding degrees of freedom.

In a travel position, the drawer mechanism can be fully retracted and locked with the corresponding interlocking device so that an interface unit can be moved together with the handling device.

In addition, the lift device can be provided for raising and lowering the handling unit in the Z direction. This unit is embodied in such a way that in a transfer position and in a service position, a movement in the Z direction is only possible if the drawer mechanism is fully extended into these positions and thus a corresponding locking device is unlocked.

Figure 4:
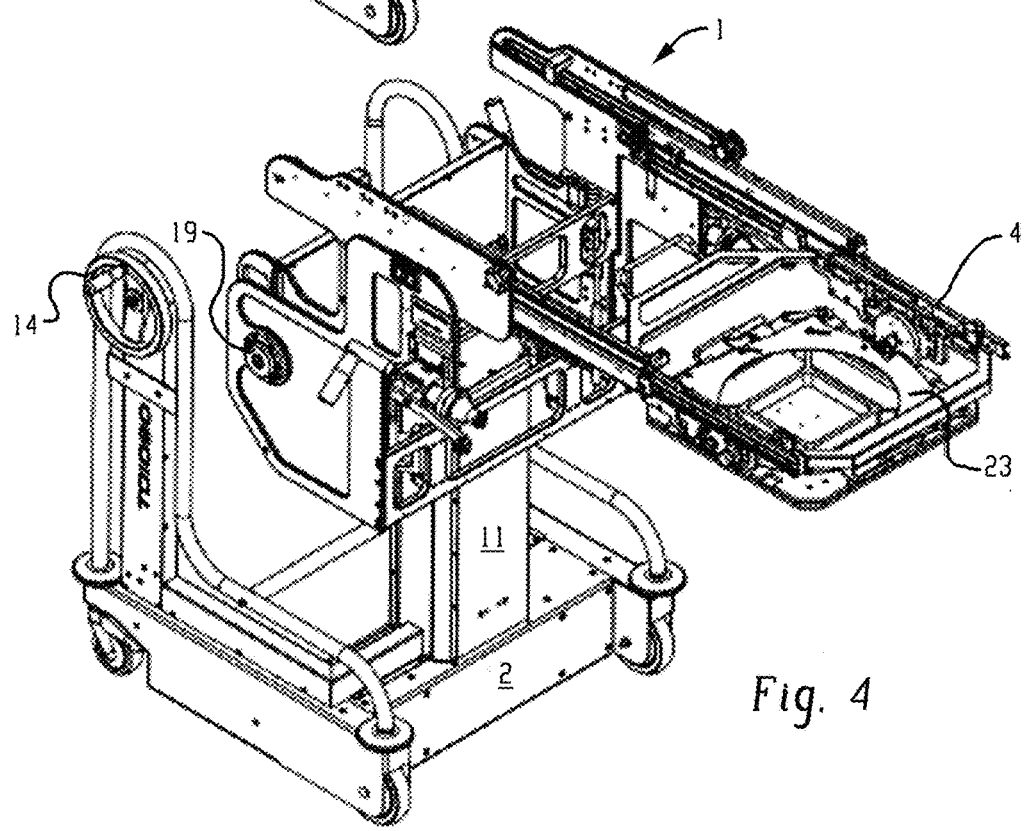
Figure 10:
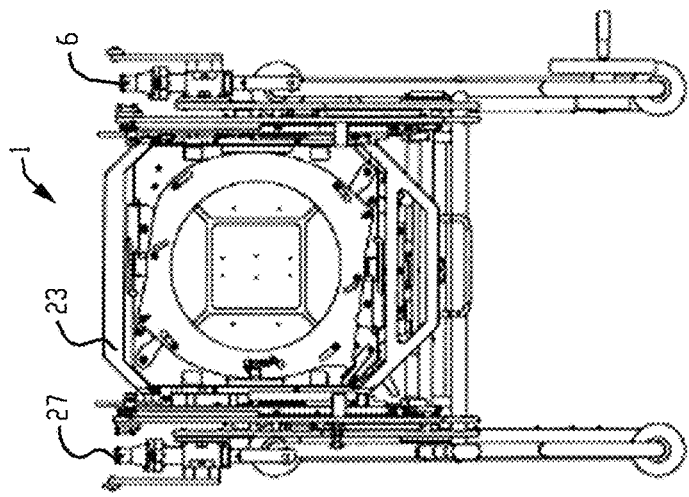
Figure 9:
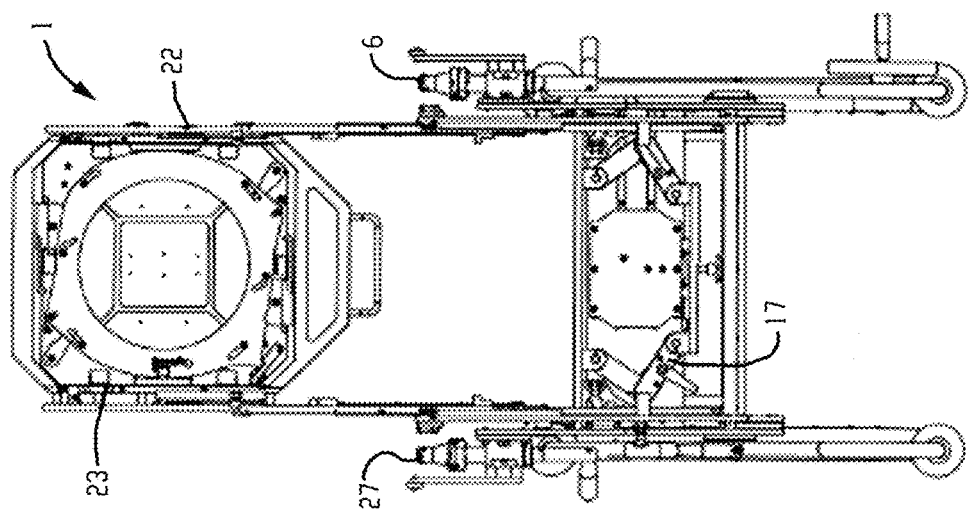
Figure 8:
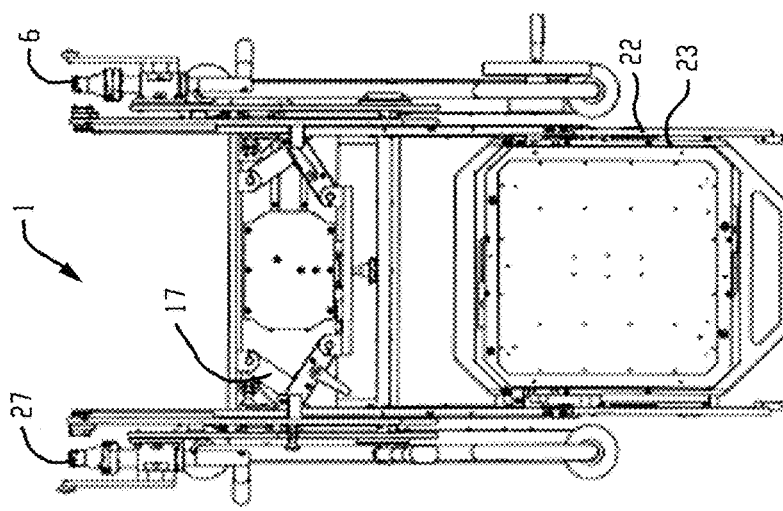
Figure 11:
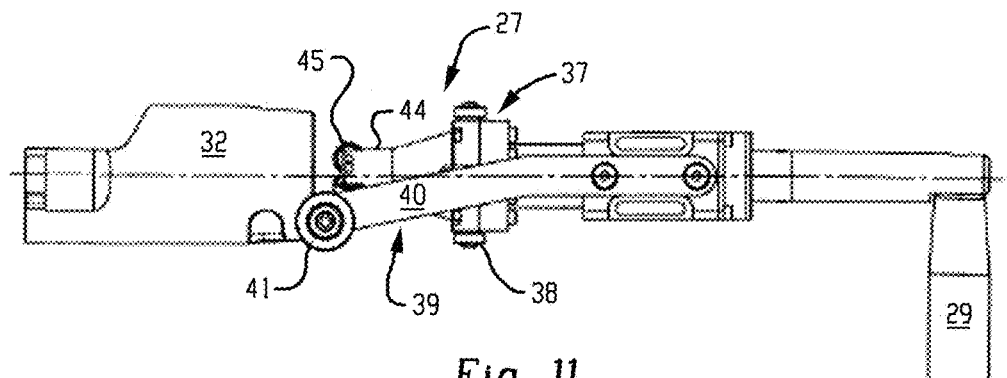
Figure 12:
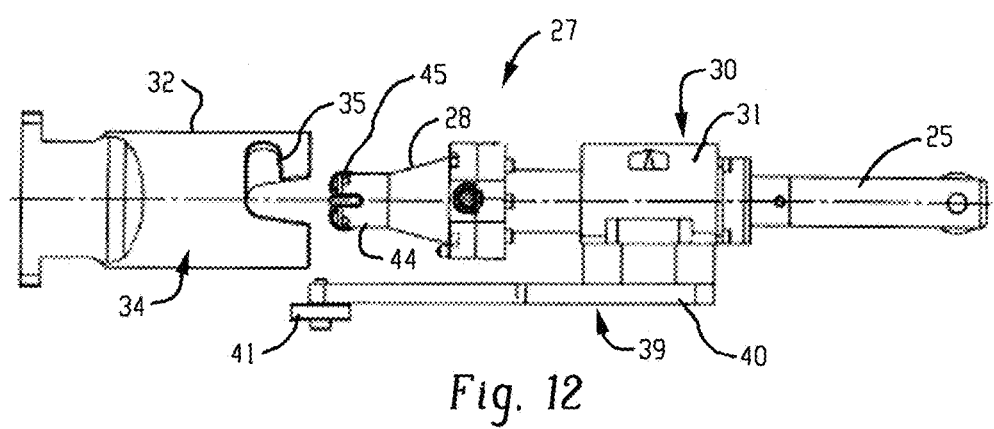
Figure 13:
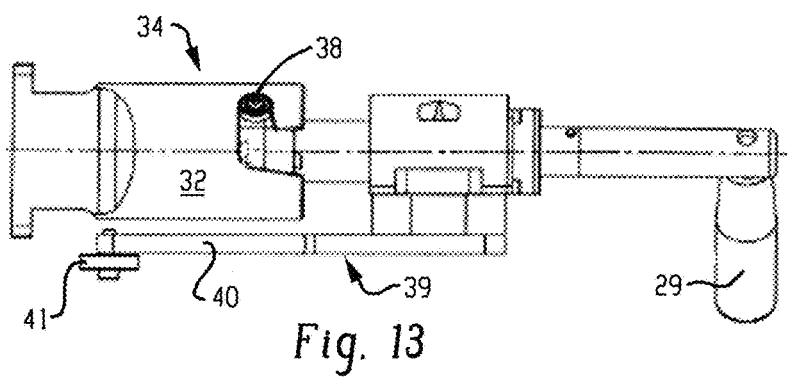
Figure 14:
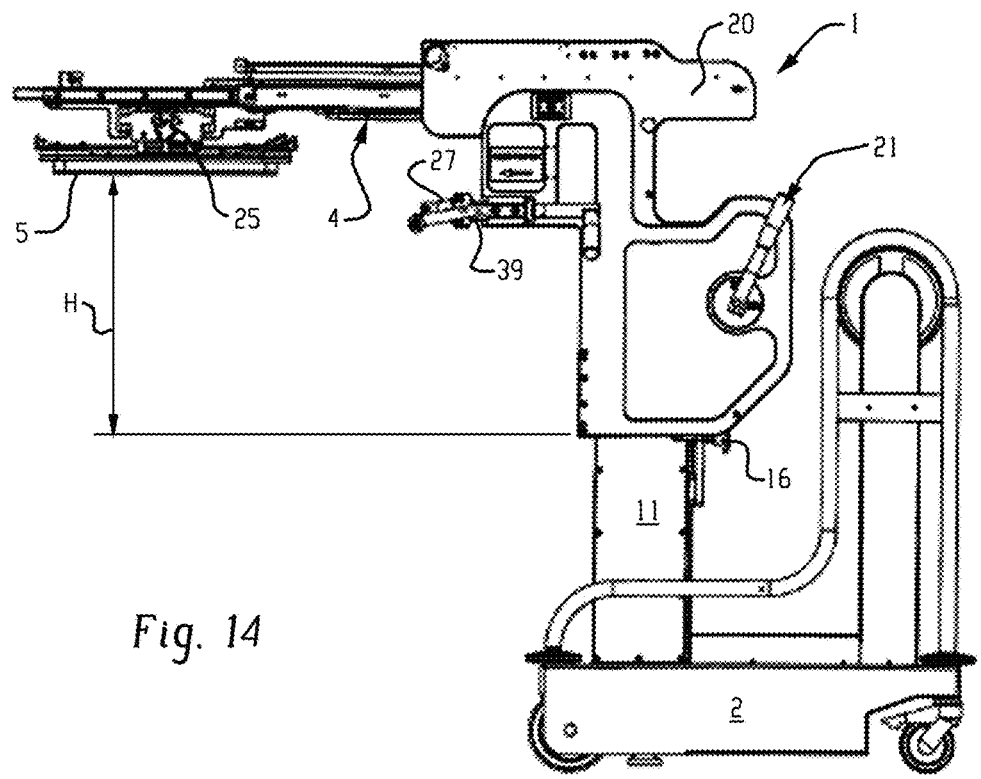
Figure 15:
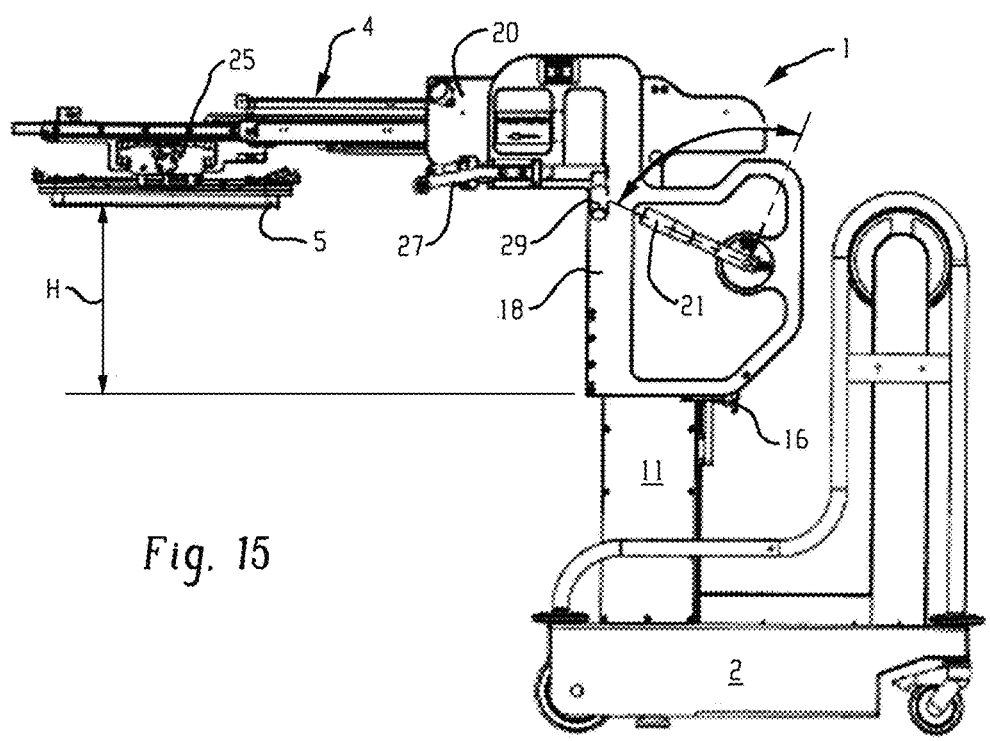
Figure 16:
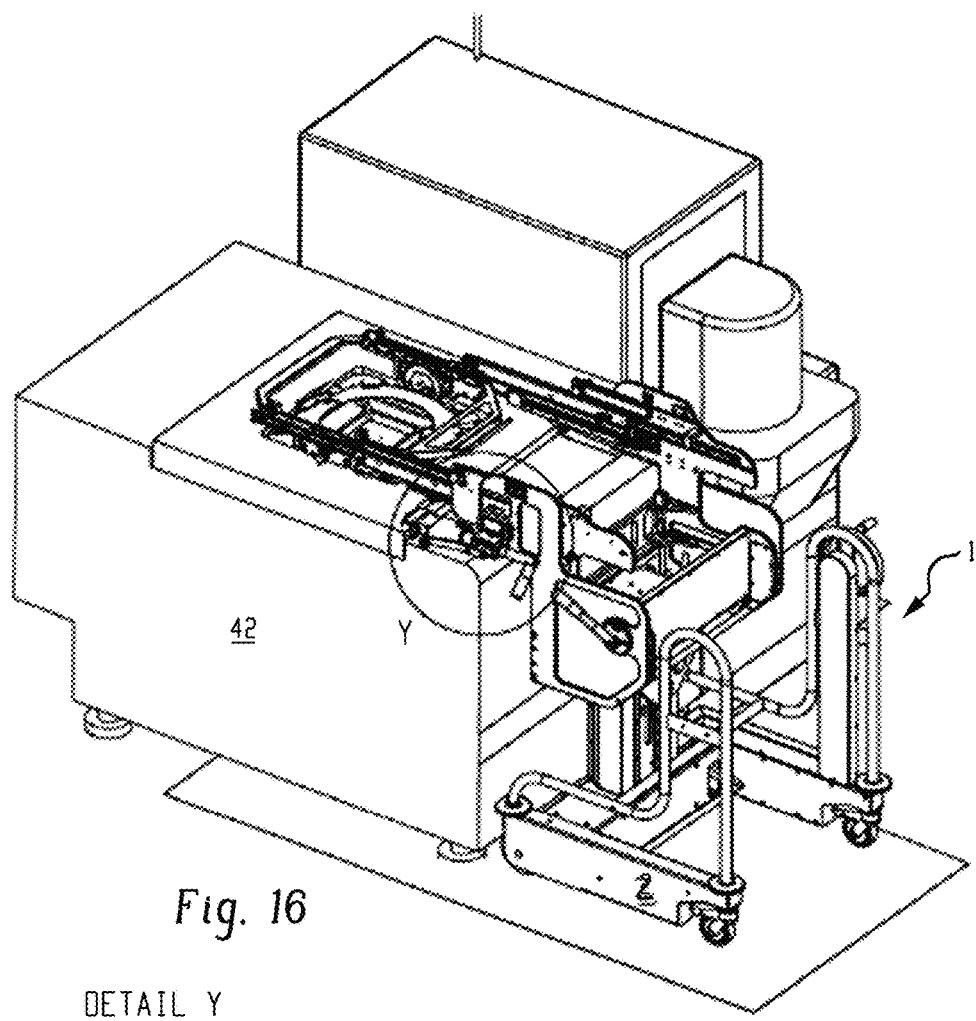
Figure 17:
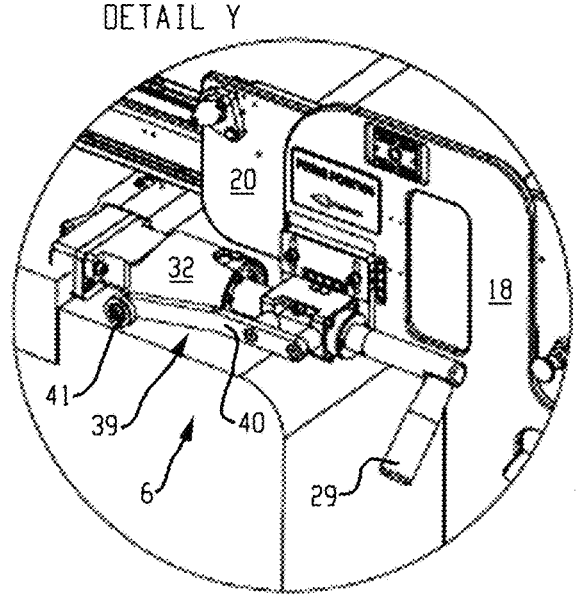
Figure 18:
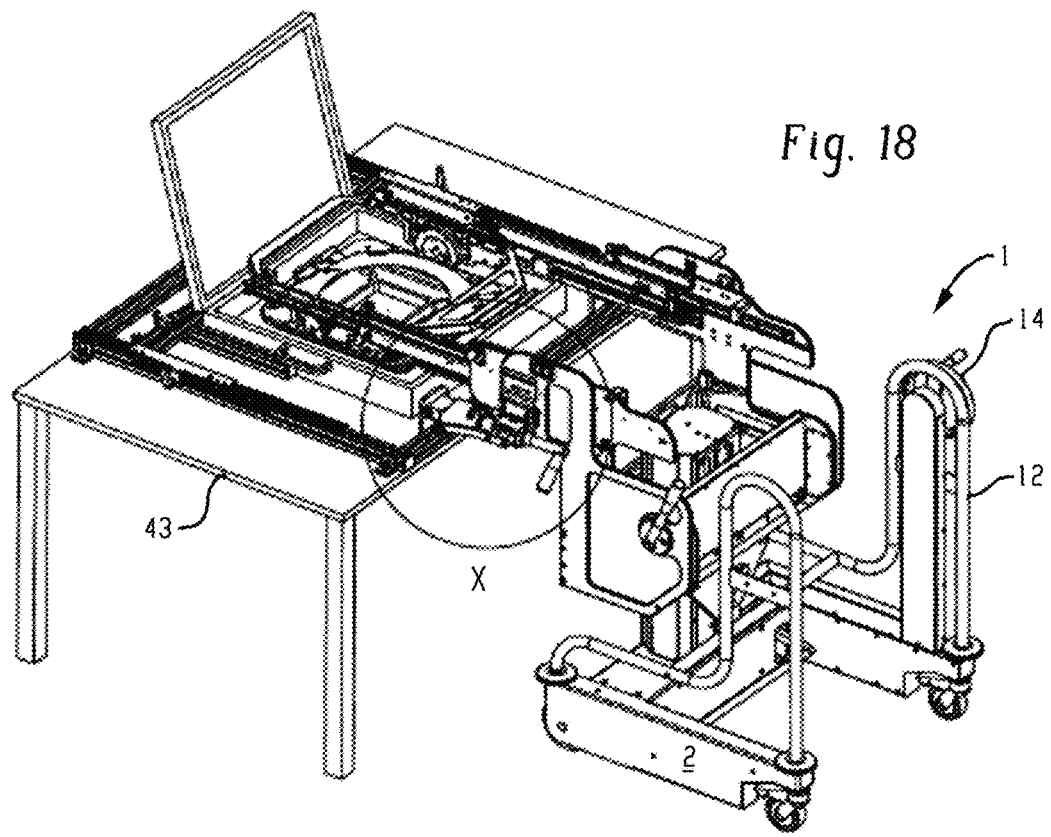
Figure 19:
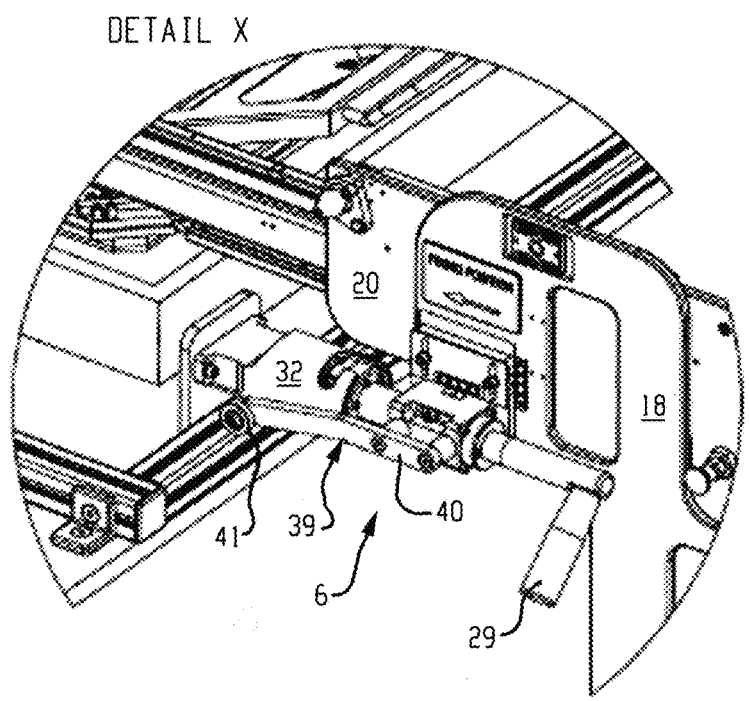
Figure 20:
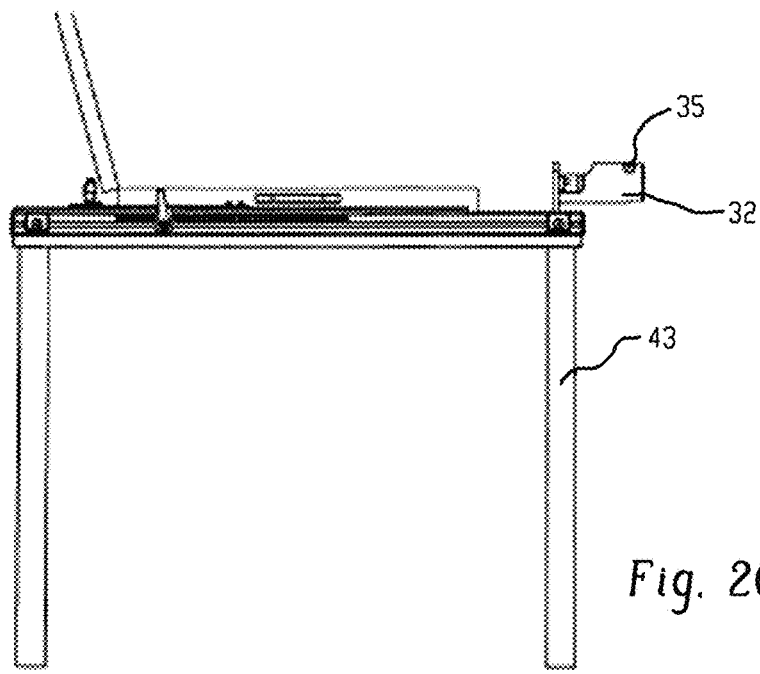
Figure 21:
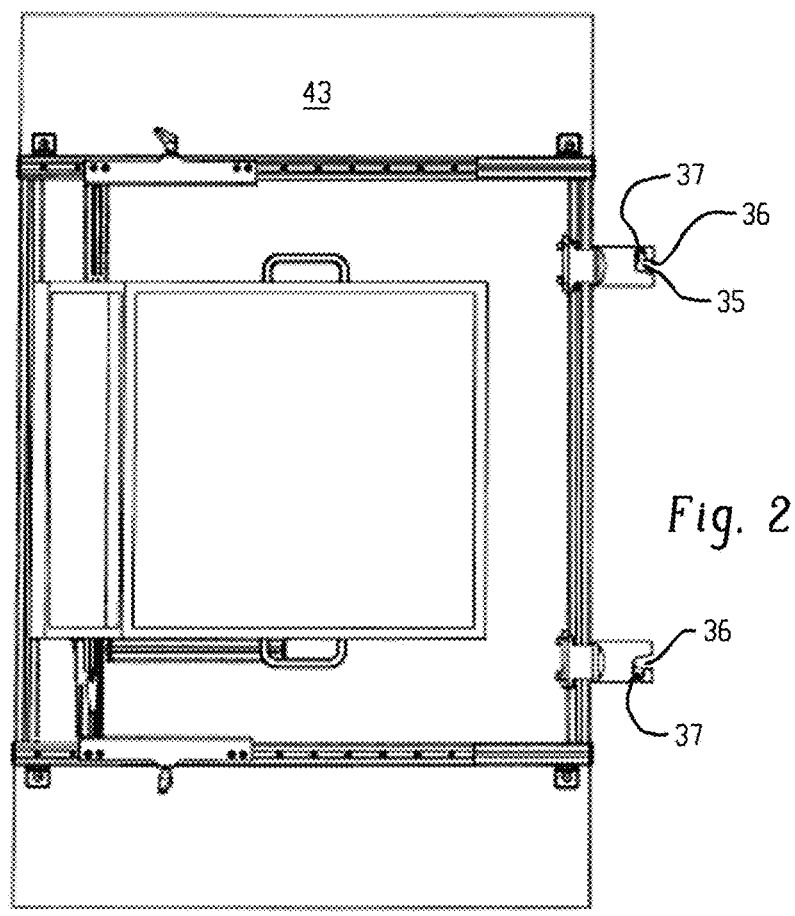
Figure 39:
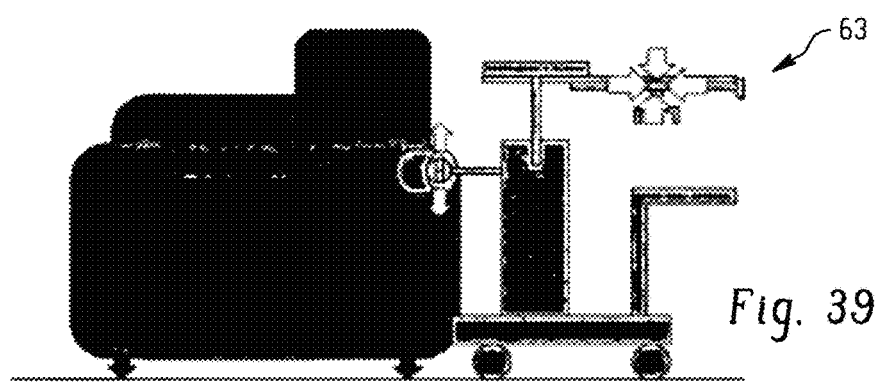
Figure 40:
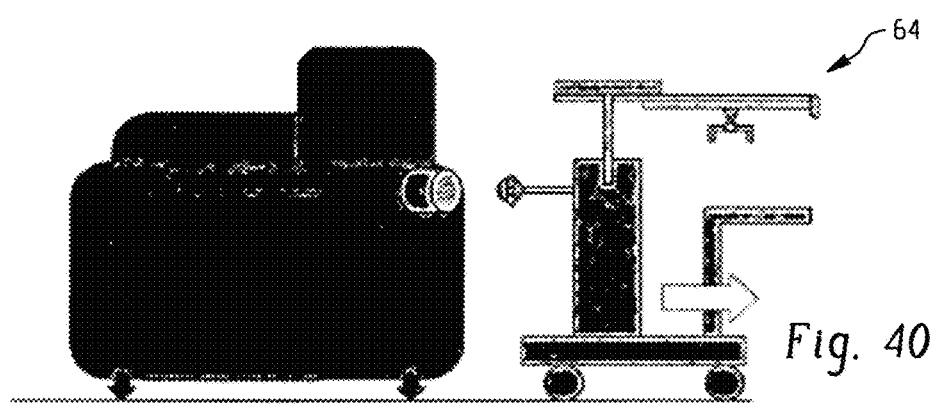
Figure 41:
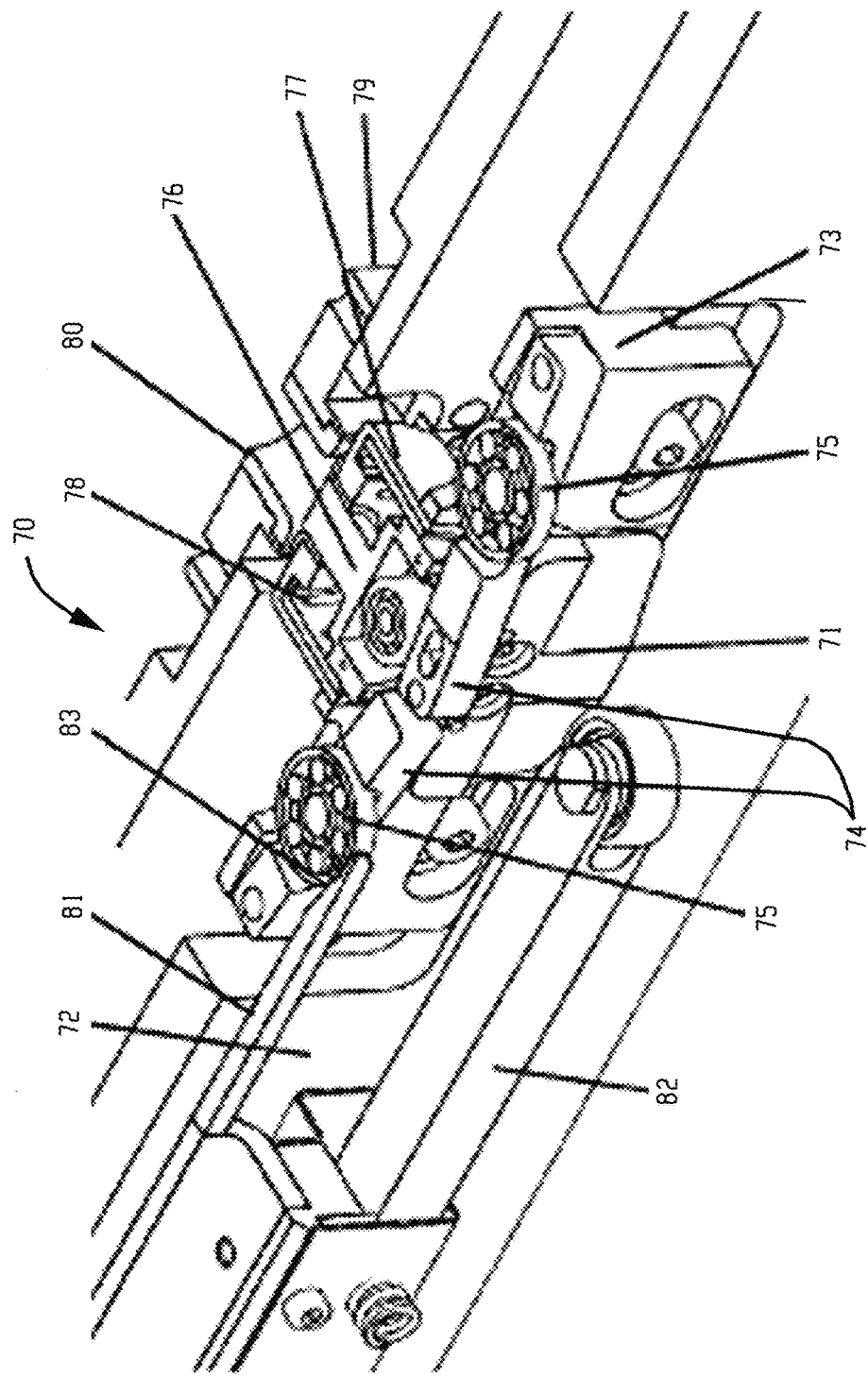
Figure 42:
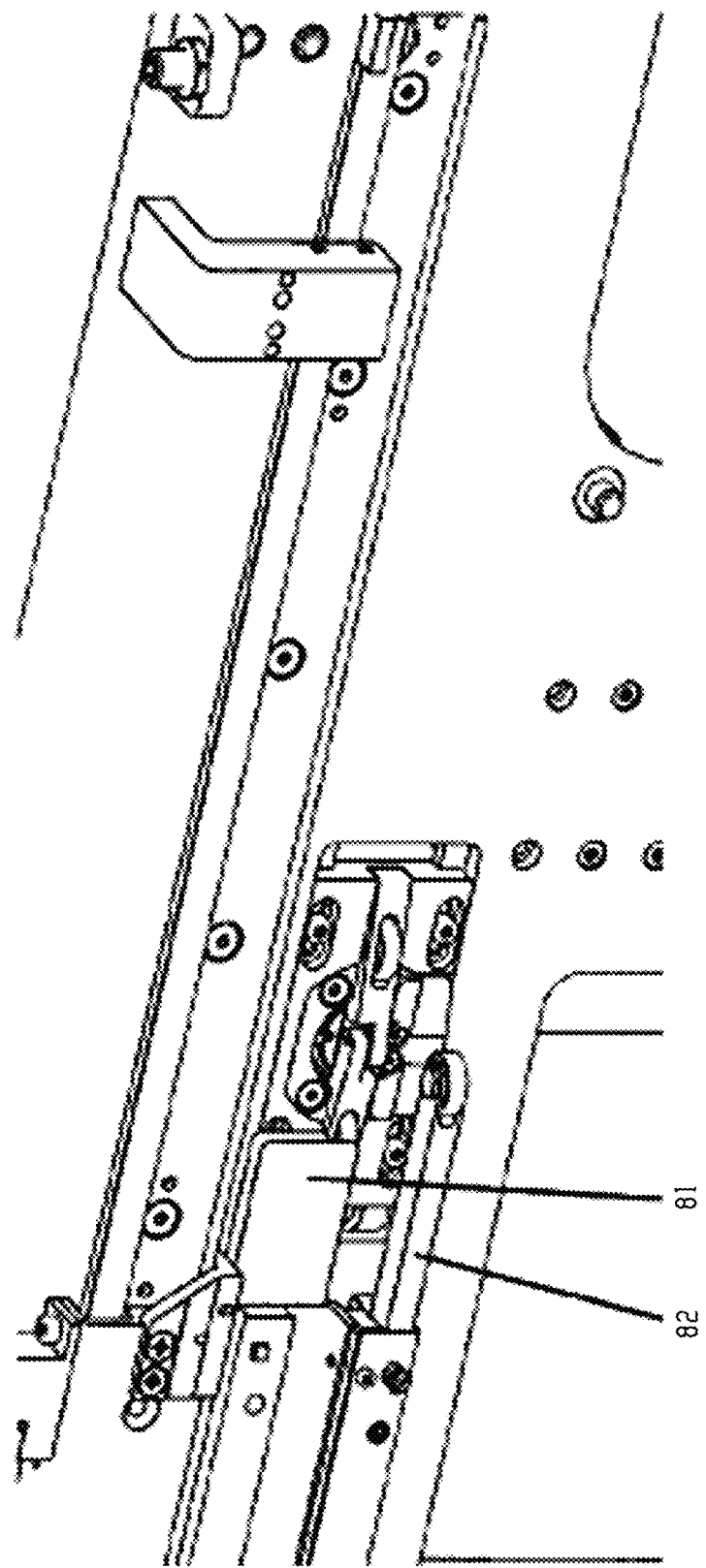
Figure 43:
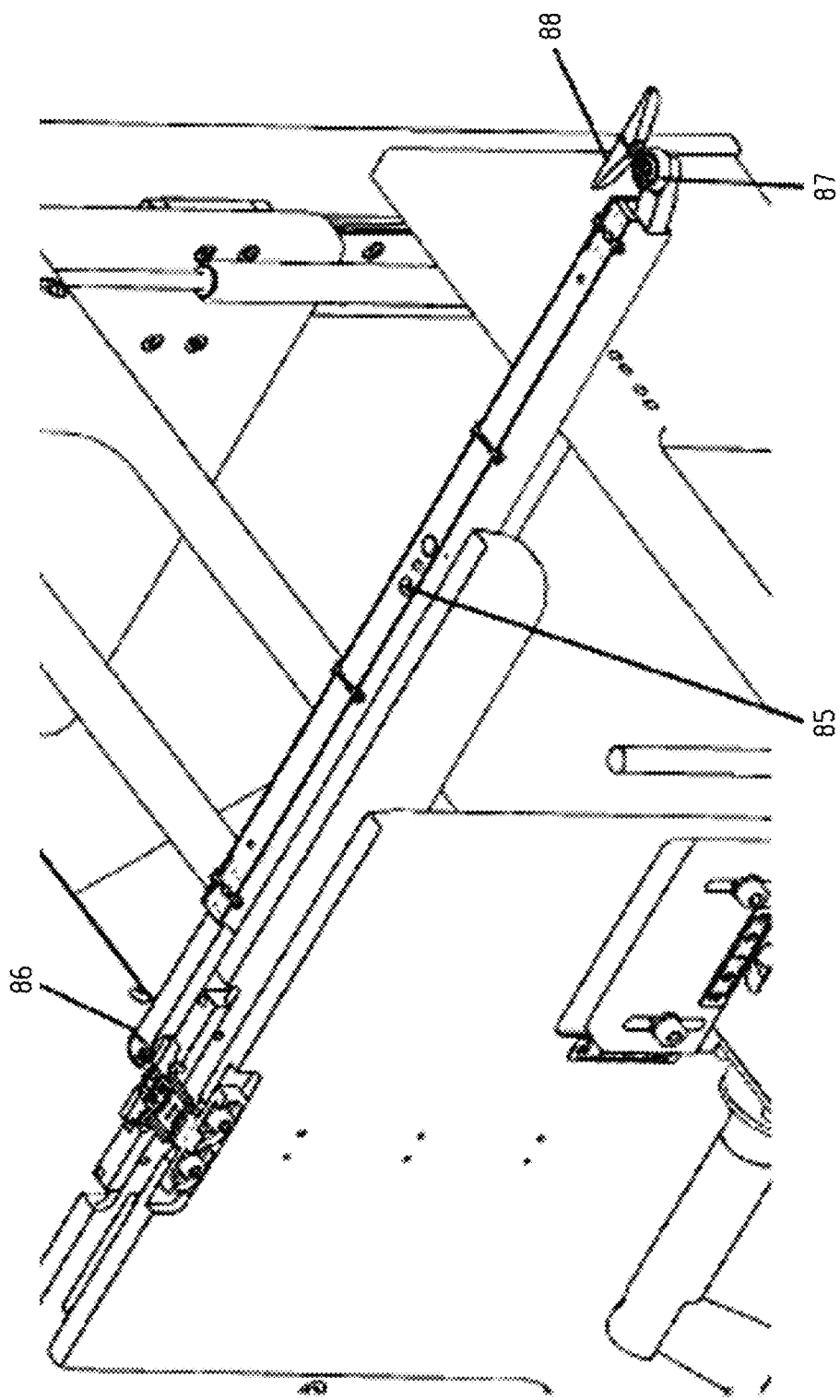
Figure 44:
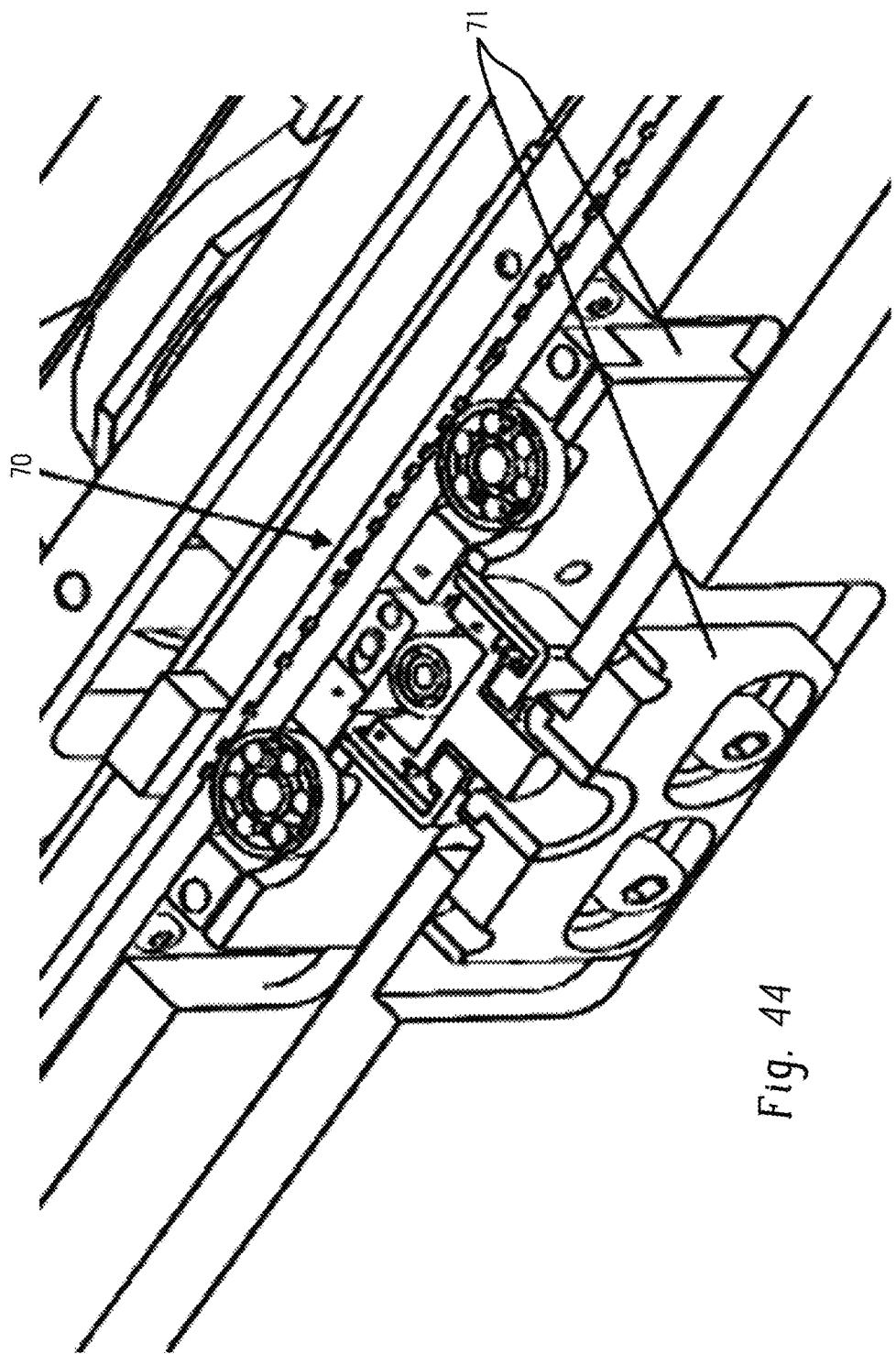
Figure 45:
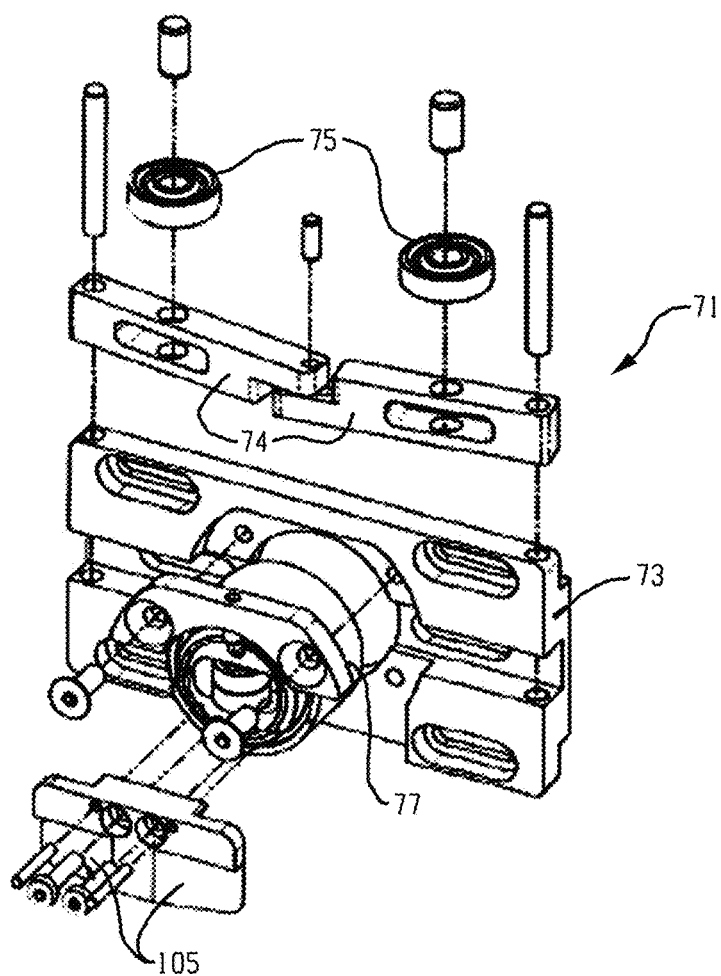
Figure 46:
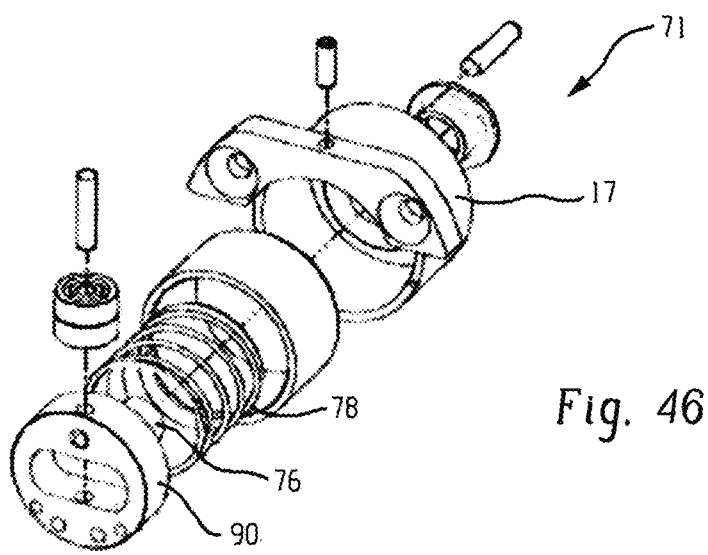
Figure 51:
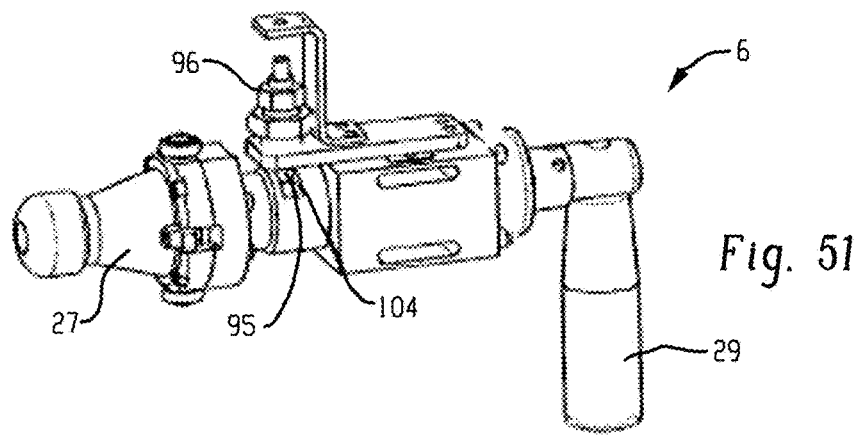
Figure 52:
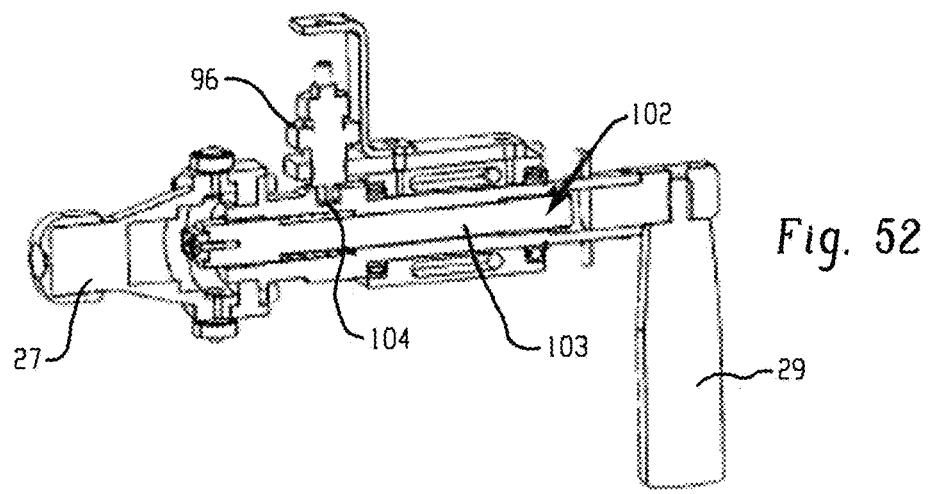
Figure 53:
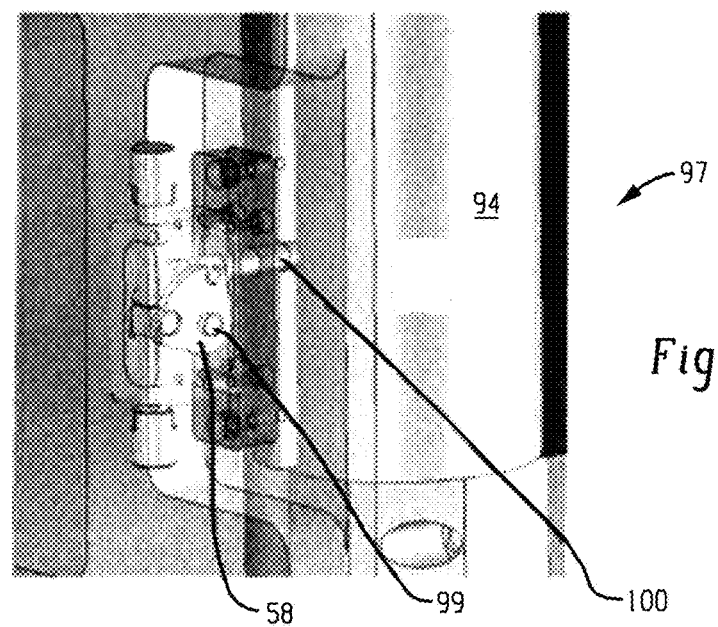
Figure 54:
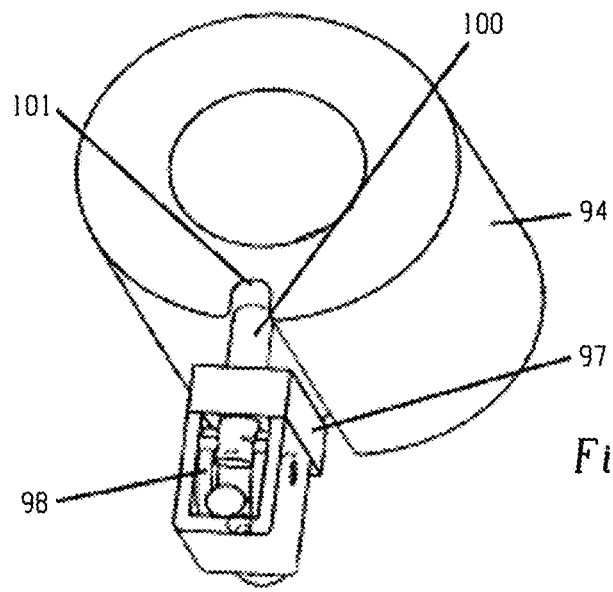
Figure 55:
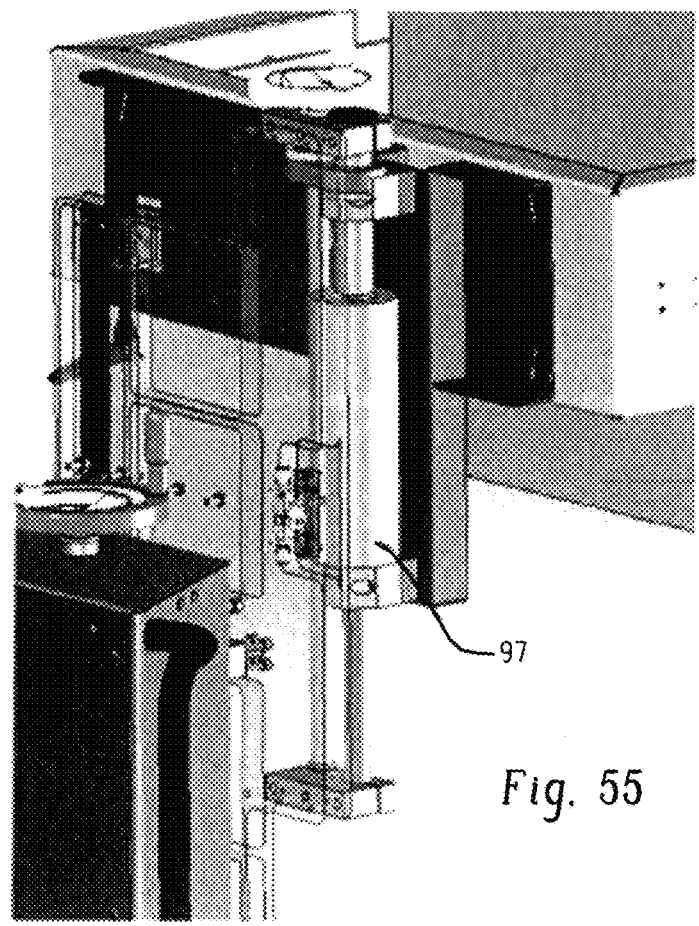

The invention will be explained in greater detail below in conjunction with the drawings. In the drawings:

FIG. 1 shows a handling device with an aligning device in a perspective view,

FIG. 2 shows the handling device from FIG. 1 with an aligning device in another perspective view, FIG. 3 shows the handling device from FIG. 1 with an aligning device in another perspective view, FIG. 4 shows the handling device from FIG. 1 with an aligning device in another perspective view, FIG. 5 shows the handling device from FIG. 1 with an aligning device in another perspective view, FIG. 6 shows the handling device from FIG. 1 with an aligning device in another perspective view, FIG. 7 shows a detail view of a rotatable mount of a frame of the handling device, FIG. 8 shows a top view of the handling device from FIG. 1 in a service position with an aligning device, FIG. 9 shows a top view of the handling device from FIG. 1 in a docking position with an aligning device, FIG. 10 shows a top view of the handling device from FIG. 1 in a travel position with an aligning device, FIG. 11 shows a side view of the aligning device in the uncoupled state, FIG. 12 shows a top view of the aligning device in the uncoupled state, FIG. 13 shows a top view of the aligning device in the coupled state, FIG. 14 shows the handling device from FIG. 1 in a docking position in the raised state, FIG. 15 shows the handling device from FIG. 1 in a docking position in the lowered state, FIG. 16 shows a testing device with a handling device coupled to it and an aligning device in a perspective view, FIG. 17 shows a detail view of the aligning device from FIG. 16, FIG. 18 shows an exchanging table with a handling device coupled to it and an aligning device in a perspective view, FIG. 19 shows a detail view of the aligning device from FIG. 18, FIG. 20 shows a side view of the exchanging table from FIG. 18 with a socket element, FIG. 21 shows a top view of the exchanging table from FIG. 18 with socket elements, FIGS. 22 to 30 show schematic depictions of a method for receiving an interface unit, which is situated on an exchanging table, by means of the handling device, FIGS. 31 to 40 show schematic depictions of a method for transferring an interface unit, which is situated on the handling device, to a prober, FIG. 41 schematically depicts a locking device according to the invention in a perspective view in the unlocked state, FIG. 42 schematically depicts the locking device according to the invention in another perspective view in the unlocked state, FIG. 43 schematically depicts the locking device according to the invention in another perspective view in the unlocked state, FIG. 44 schematically depicts the locking device according to the invention in another perspective view in the locked state, FIG. 45 shows an exploded view of a locking mechanism of a locking device, FIG. 46 shows an exploded view of a locking lug of the locking device, FIG. 47 shows another exemplary embodiment of the handling device according to the invention with an aligning device in a perspective view, FIG. 48 is a detail view of a part of the aligning device from FIG. 47, FIG. 49 shows the handling device from FIG. 47 in a perspective view in a state in which it is coupled to a prober, FIG. 50 shows a detail view of the aligning device from FIG. 49, FIG. 51 shows another exemplary embodiment of an aligning device in a perspective view, FIG. 52 shows a longitudinal section through the aligning device from FIG. 51, FIG. 53 shows a securing mechanism in a perspective side view, FIG. 54 shows the securing mechanism from FIG. 53 in a perspective view from above, and FIG. 55 shows a swivel mechanism with a securing mechanism in a perspective view.

A handling device 1 is embodied for receiving an interface unit (FIG. 1 through FIG. 10).

The handling device 1 includes a chassis 2 for moving the handling device 1. On the chassis 2, a handling unit 3 is provided, which can move in the vertical Z direction. The handling unit 3 has a receiving device 4, which can be linearly extended and retracted in the horizontal direction and is for receiving an interface unit.

On the handling unit 3, an aligning device 6 is provided to achieve a positionally accurate coupling of the handling unit 3 to another device for receiving at least one interface unit.

The chassis 2 will be described in greater detail below.

The chassis 2 includes an approximately U-shaped frame 7. A swiveling wheel 8 is mounted on each of the free legs of the frame 7. At the opposite end from the swiveling wheels 8, two additional wheels 9 are provided on the base leg. These wheels 9 can be locked by means of a braking device 10. The braking device 10 includes two compression spring-equipped adjustable feet, which can be lowered to the floor by means of a lever mechanism. It is thus possible to position the handling device in a stationary fashion so that the exchange of an interface unit can be carried out.

Each leg of the U-shaped frame 7 is provided with a handrail 12. The handrail 12 permits the handling device 1 to be moved by a user.

In the region between the two non-swiveling wheels 9 on the base leg of the U-shaped frame 7, a column unit 11 is provided that extends in the vertical direction.

The handling unit 3 is mounted on the column unit 11 so that it can be moved in the vertical Z direction. The moving in the Z direction is carried out by means of a sliding device 13.

For actuation of the sliding device 13, a crank element 14 is provided on one of the two handrails 12. Preferably, a scale is mounted on the crank element 14 in order to facilitate correctly presetting the height of the handling unit in relation to a device for receiving an interface unit.

The crank element 14 is operatively connected to the sliding device 13 in such a way that turning the crank element 14 causes the handling unit 3 to slide by means of the sliding device 13.

The sliding device 13 includes a gear in order to transmit the rotary motion of the crank element 14 to a worm drive for the travel in the Z direction.

The sliding device 13 has a plate-shaped connecting element 15. On the plate-shaped connecting element, a screw-like interlocking device 16 by means of which the sliding device 13 can be immobilized in the Z direction.

The handling unit 3 will be described in greater detail below.

The plate-shaped connecting element 15 is connected by means of two respective lever arms of a hinge mechanism 17 to an outer frame unit 18 of the handling unit 3 in such a way that the handling unit 3 can execute a relative movement in the horizontal plane.

The outer frame unit 18 is coupled to an inner lift frame unit 20 by means of a lift mechanism 19.

The lift mechanism 19 is provided with a swiveling lever 21 for actuation. By means of the lift mechanism 19, the lift frame unit 20 can be raised and lowered for a predetermined distance in the vertical Z direction. The lift mechanism 19 is embodied so that the raising and lowering of the lift frame unit 20 is carried out by means of a lifting link.

The swiveling lever 21 is connected to a swivel shaft. The swivel shaft is supported in rotary fashion in the outer frame unit 18.

The swivel shaft is connected to two lifting link elements by means of feather keys. Each of the lifting link elements is provided with a cam track.

An elongated guide recess extending in the Z direction is provided in the outer frame unit 18.

The lift frame unit 20 has pin-like bearings, e.g. deep groove ball bearings, affixed to it, which are accommodated in the cam tracks of the lifting link elements and thus extend through the cam tracks in such a way that they are guided in the guide recess.

Through a swiveling motion of the swiveling lever 21, the lifting shaft along with the lifting link element is swiveled or rotated in such a way that the bearings attached to the lift frame unit 20 are slid in the Z direction because of the guide recess.

This movement produces the raising or lowering of the lift frame unit 20 in the Z direction. The stroke H in the Z direction is between 50 mm and 200 mm, or more precisely between 100 mm and 150 mm, and preferably 127 mm. By means of the stroke motion, an interface unit can be inserted into or withdrawn from a testing device. Preferably, a predetermined stroke is variably adjustable so that the handling device can be adapted to different testing systems.

This stroke preferably occurs with a rotary motion of the swiveling lever by 90°. Alternatively, a crank element or an electric traversing device can be provided instead of the swiveling lever 21.

For fixing purposes, the swiveling lever 21 can be provided with a detent element, which has at least two detent positions, a lowered position and a raised position. These positions are referred to as the "docking position" and the supply position.

The receiving device that can be linearly extended and retracted in the horizontal direction 4 is provided at the upper end of the lift frame unit 20 in the vertical Z direction.

The receiving device 4 that can be linearly extended and retracted in the horizontal direction can be embodied as a drawer mechanism 4 that can be extended and retracted in telescope fashion.

The drawer mechanism 4 includes two retractable and extendable guide rails 22. An extending length of the drawer mechanism 4 is variably adjustable so that the handling device 1 can be adapted to different systems.

A frame 23 is affixed in the region between the guide rails 22.

Instead of the drawer mechanism, the linearly extendable and retractable receiving device 4 can also be embodied as a linear sliding device. For example, the linear sliding device includes a toothed rack and a guide device with a rail or wheels.

Basically, the linearly extendable and retractable receiving device 4 is embodied to be as rigid and compact as possible in order to correspond with the requirements in clean rooms, but also because often docking elements reduce the amount of space available on the testing devices. A high rigidity is required in order to permit a positionally accurate positioning of the interface unit.

The frame 23 is connected to the guide rails 22 by means of rubber elements 24.

The inside of the frame 23 accommodates the receiving unit 5, which is coupled to the frame 23 by means of a rotatable mount 25 (FIG. 7). The rotatable mount 25 permits a rotation of the receiving unit around a horizontal axis in order to permit inspection of an interface unit. The rotatable mount 25 can be immobilized by means of an interlocking device 26.

The receiving unit 5 for receiving the interface unit preferably has gripper elements (not shown), which can engage in corresponding recesses or undercuts in the interface unit in order to thus affix the interface unit to the receiving unit 5. In a simplified embodiment, the receiving unit 5 can, for example, have four screws that are screwed into the interface unit.

According to an alternative embodiment, the gripper elements, together with a special adapter, can also be retrofitted onto a known handling device such as the one disclosed in DE 101 32 489 B4 so that by means of such a device, interface units can be supplied to and removed from a testing device. The gripping device can be triggered, for example, by virtue of the fact that the special adapter for connecting the gripper elements to the device is connected to a control unit thereof in such a way that the gripper elements can be actuated by this control unit.

The retrofitting of the gripper elements is preferably carried out in connection with the retrofitting of the aligning device on such a device.

The aligning device 6 will be described in greater detail below.

The aligning device 6 is provided for the positionally accurate coupling of a handling device for exchanging an interface unit to another device for receiving at least one interface unit (FIGS. 11 to 13).

The aligning device 6 is embodied in accordance with the plug and socket principle and has at least one plug-like centering element 27. A mating section 28 is embodied on the centering element. The mating section 28 is preferably embodied as a conical section. It is also possible to have a cylindrical embodiment or any other shape that permits an exact positioning.

The aligning device 6 also includes a socket element 32 that is embodied in accordance with the centering element 27 for receiving the centering element 27.

If the centering element 27 is placed in the socket element 32, a positionally accurate coupling of the handling device 1 to another device for receiving at least one interface unit is assured.

Two centering elements 27 extending in the horizontal direction are mounted to the outer frame unit 18 of the handling device 1.

The centering element 27 includes a locking lever 29—which is integrally formed onto the centering element, a cylindrical bearing section 30, and a conical section 28. Also, two detent lugs or locking lugs 38 are spaced equidistantly from each other are embodied on the radial circumference in the vicinity of the conical section 26. The provision of two locking lugs 38 ensures a uniform tensile force. It is also possible, however, to provide only one locking lug 38 or several of them.

The locking lever 29 can also be decoupled from the centering element and socket element and situated at another suitable position of the handling device, as long as it produces a complete insertion of the centering element 27 into the socket element 32.

At the front end of the conical section 28, there is preferably a cylindrical section 44 with three insertion rollers 45 spaced equidistantly apart from one another in the radial direction. Instead of the insertion rollers 45, it is also possible for a ball element or another suitable insertion aid to be provided.

A corresponding bearing bush 31 that is affixed to the outer frame unit 18 accommodates the bearing section 30 so that it is able to rotate around its longitudinal direction.

The bearing bush 31 has a guide element 39 fastened to it, with a guide arm 40 and a guide wheel 41. The guide arm 40 extends approximately in the horizontal direction and assists in the positioning of the centering element 27 in relation to a socket element 32 in the horizontal plane. This occurs in that during the docking, the guide wheel 41 rolls along a horizontal section of a device for receiving at least one interface unit. In this way, the centering element can be aligned in the Z direction in relation to the socket element and thus facilitates the insertion of the centering element 32 into the socket element. This alignment is additionally assisted by the resilient support of the handling unit 3. Furthermore, the guide element 39 has a stop, which prevents damage to one of the two parts if the centering element 27 is incorrectly positioned in relation to the socket element 32.

A device for receiving an interface unit can be provided with a vertical surface that transitions via a surface with a predetermined radius into a horizontal surface (FIG. 16, FIG. 17).

These surfaces in connection with the guide arm 40 have the effect that if the centering element is positioned too low, the guide wheel strikes against the vertical surface in the horizontal direction before a centering element 27 travels into a corresponding socket element.

If the offset is only slight and can be compensated for by the handling device 1 by means of the resilient support, then the guide wheel 41 slides across the surface with a predetermined radius onto the horizontal surface. In this way, the centering element 27 is optimally aligned in the Z direction in relation to the corresponding socket element 32.

Two socket elements 32 are correspondingly affixed to another device for receiving at least one interface unit. The socket elements include a fastening section 33 and a conical centering section 34 for receiving of the conical section 28 of the centering element 27.

The centering section 34 is embodied in the form of a socket and in its outer circumference wall, has two locking and tightening sockets 35 or detent recesses. The locking and tightening sockets 35 include an insertion section 36 and two locking and tightening sections 37 embodied in the form of undercuts in the locking and tightening recess 35.

In order to accommodate the cylindrical section 44 with the three insertion rollers 45 of the centering element spaced equidistantly apart from one another in the radial direction, the insertion socket has a corresponding receiving section. The insertion rollers 45 prevent a removal of material during the assembly of the centering element 27 and socket element 32 so that the aligning device 6 is suitable for use in clean rooms.

When the centering element 27 is actuated by means of the locking lever 29, the centering element is rotated around its longitudinal axis, thus permitting the locking lugs 38 or the detent lugs to be positioned in the locking and tightening sections 37. In the course of this, the locking lugs 38 have slid along the insertion sections and then, through the rotation of the locking lever 29, into the locking and tightening sections 37. In this way, the centering element 27 is completely retracted into the socket element 32 and fixed in position.

This ensures a positionally accurate coupling of the handling device 1 to another device for receiving at least one interface unit.

The hinge mechanism and/or the resilient support and/or the rotatable support and/or the receiving device that can be linearly extended and retracted in the horizontal direction and/or the sliding device and/or the lift mechanism has/have an interlocking device with which the corresponding degrees of freedom can be immobilized.

In the following, a detailed description is given of the function of the aligning device 6 for the positionally accurate coupling of a handling device 1 for exchanging an interface unit to another device for receiving at least one interface unit and to the handling device 1 for exchanging an interface unit.

The function is described, for example, in conjunction with the removal of an interface unit from a testing device 42. In this case, the interface unit is taken out of the testing device 42 from above (FIG. 14, FIG. 15).

Naturally, the handling device according to the invention 1 also makes it possible to remove an interface unit from below. With the handling device, it is also possible to set an interface unit down on an exchanging table 43 or to pick it up from there (FIG. 18 to FIG. 21)

First, a presetting of the height of the handling unit 3 in the Z direction is carried out by actuating the crank 14. In this way, a vertical adjustment of the centering elements 27 in relation to the socket elements 32 is carried out.

Then the handling device 1 is pushed against a testing device 42.

The pushing-against is carried out in such a way that the centering elements 27 of the handling device 1 are inserted into the socket elements 32 situated on a testing device 42.

During docking, the guide wheel 41 of the guide arm in this case first rolls along a horizontal section of a device for receiving at least one interface unit. In this way, the centering element 27 is oriented in the Z direction in relation to the socket element 32 and thus simplifies the insertion of the centering element 27 into the socket element 32.

When the centering element 27 has been fully inserted into the socket element, then the locking levers 29 are rotated by 45° around their longitudinal axis.

Through actuation of a locking lever 29, the corresponding locking lug 38 engages in the locking and tightening section 37 so that the centering element is pulled all the way against the socket element 32 and is fixed in position in it.

In this way, the handling device 1 is connected to a testing device 42 in a positionally accurate fashion, both with regard to the distance from the testing device 42 and with regard to the height of the handling unit 3.

Then, the drawer mechanism 4 is extended into a supply position and is locked in the extended state by means of the corresponding interlocking device (FIG. 14).

Then the swiveling lever 21 is actuated in order to lower the extendable drawer mechanism 4 in such a way that the receiving unit 5 is spaced slightly apart from the interface unit (FIG. 15). An actuation of the swiveling lever 21 is only possible if the drawer mechanism 4 or the linearly retractable and extendable receiving device is fully extended by its predetermined length and locked in position.

Then the receiving unit 5 or frame 23 of the drawer mechanism 4 is fastened to the interface unit by means of the gripping device.

Then the swiveling lever 21 is actuated again in order to lift up the drawer mechanism 4 together with the interface unit.

The stroke achieved by means of the swiveling lever enables a positionally accurate positioning or removal when placing or removing an interface unit into or from a testing device and in this way, facilitates the handling for the user since it rules out the occurrence of damage to the interface unit thanks to the preset stroke.

In order to move the handling device, the drawer mechanism is retracted into a transport position and once again locked (FIG. 10).

It is also possible to move the drawer mechanism toward the handrail into a service position (FIG. 8). In the service position, the frame 23 can be swiveled by 180° so that the contact elements that are situated on the underside of the interface unit can be inspected by a user, for example by means of a magnifying glass or microscope.

The receiving of an interface unit situated on the exchanging table 43 by means of the handling device 1 will be described in greater detail below (FIGS. 22 to 30).

Figure 22:
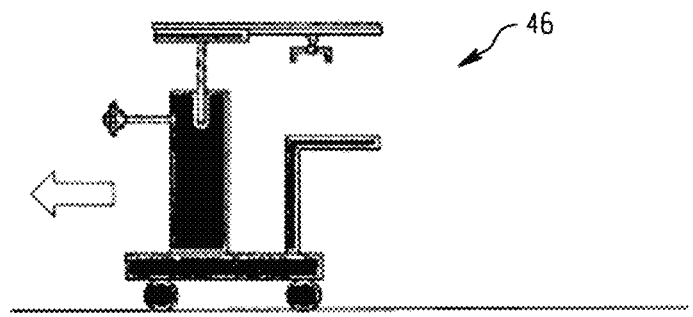

First, the handling device 1 is moved up against the exchanging table 43. In the meantime, the lift mechanism 19 is secured by means of a locking device 70 in such a way that no height adjustment in the Z direction is possible (step 50; FIG. 22). The locking device 70 will be described in even greater detail below.

Figure 23:
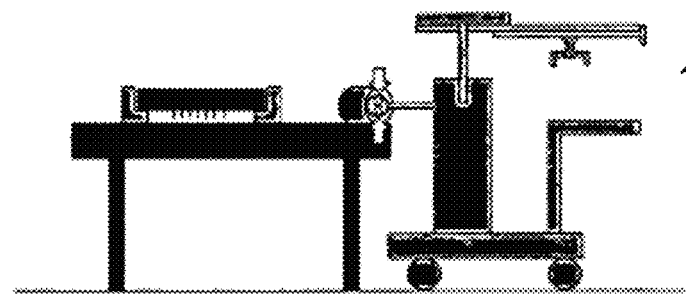

On the exchanging table 43, there is a socket element 32 into which the corresponding centering element 27 of the handling device is inserted and locked in position therein (step 51; FIG. 23).

The locking is executed by means of a 45° rotation of the locking lever 29 around its longitudinal axis. Steps 51 and 52 have already been described extensively above.

Figure 24:
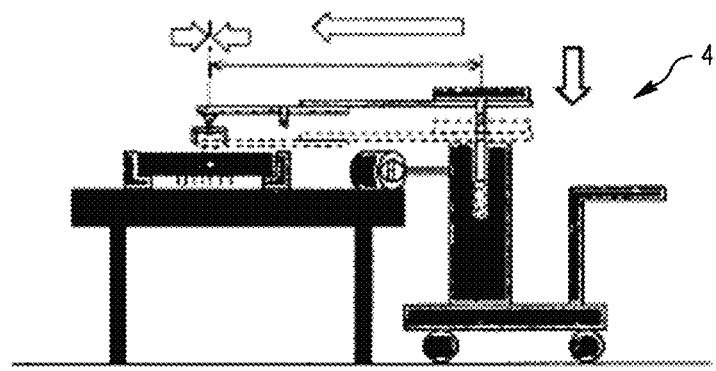

Then the receiving device that can be linearly extended and retracted in the horizontal direction or the drawer mechanism 4 is fully extended into the transfer position (step 52; FIG. 24). During steps 50 through 51, no height adjustment in the Z direction is possible. When the drawer mechanism is fully extended, the locking device 70 unlocks. After the drawer mechanism is fully extended, the handling unit 3 is lowered in the Z direction by actuating the crank 14.

Figure 25:
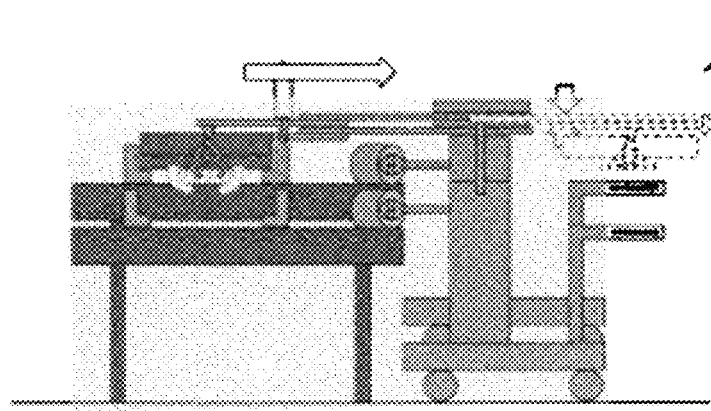

In a subsequent step, a fixing device (not shown) situated on the drawer mechanism 4 engages the interface unit (step 53; FIG. 25).

Figure 26:
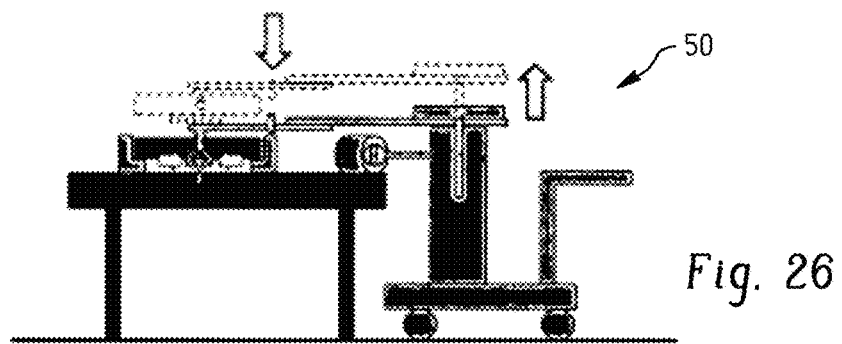

Then the drawer mechanism 4 is lifted together with the interface unit (step 54; FIG. 26).

Figure 27:
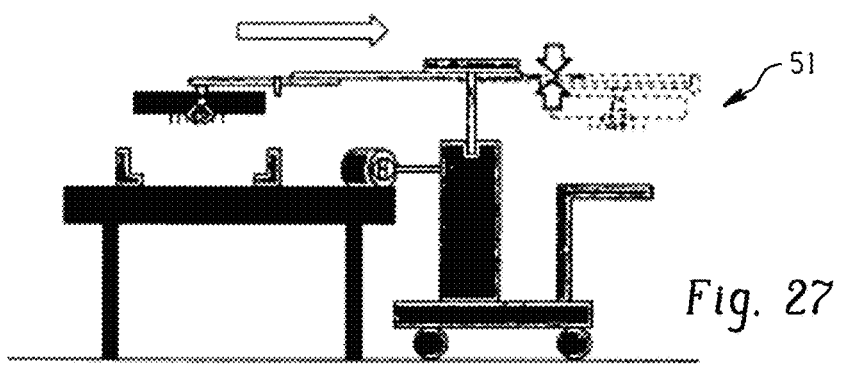

When the drawer mechanism 4 has reached an upper end position, the drawer mechanism is retracted into the travel position (step 55; FIG. 27).

Figure 28:
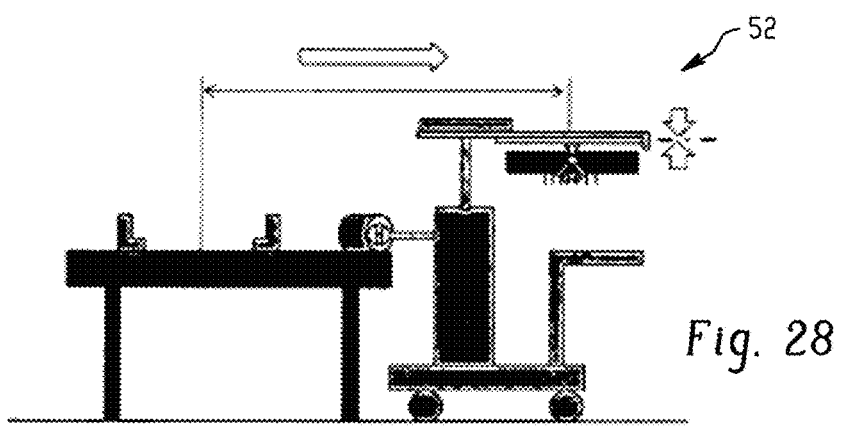

When the drawer mechanism is retracted into the travel position, the height adjusting device 19 is locked in the Z direction by means of the locking device (step 56; FIG. 28).

Figure 29:
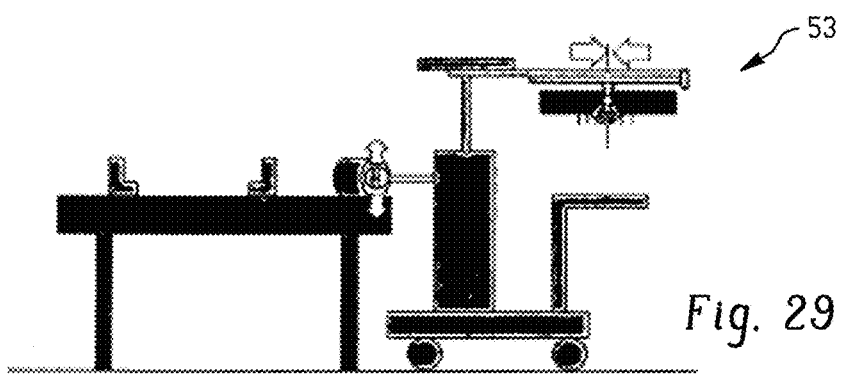

In the next step, the centering element 27 is unlocked from the socket element 32 (step 57; FIG. 29).

Figure 30:
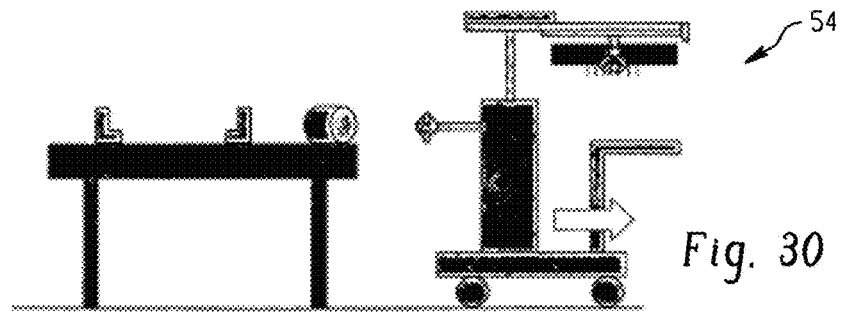

Then the handling device 1 with the interface unit on it can be safely and reliably moved (step 58; FIG. 30).

The transfer of an interface unit situated on the handling device 1 to a prober will be described below (FIGS. 31 to 40).

Figure 31:
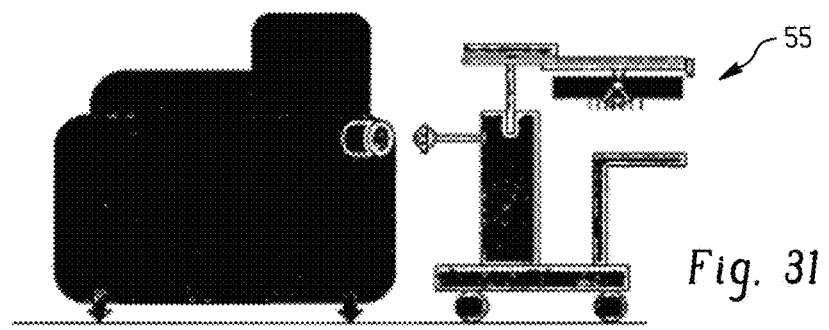

First, the handling device 1 with the interface unit is moved up against the prober (step 60; FIG. 31).

Figure 32:
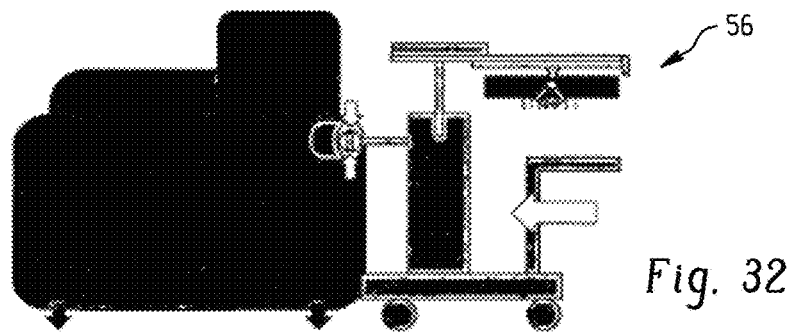

In a subsequent step, the centering element 27 of the handling device 1 is placed in a corresponding socket element 32 of the prober (step 61; FIG. 32). The centering element is correspondingly locked in the socket element.

Figure 33:
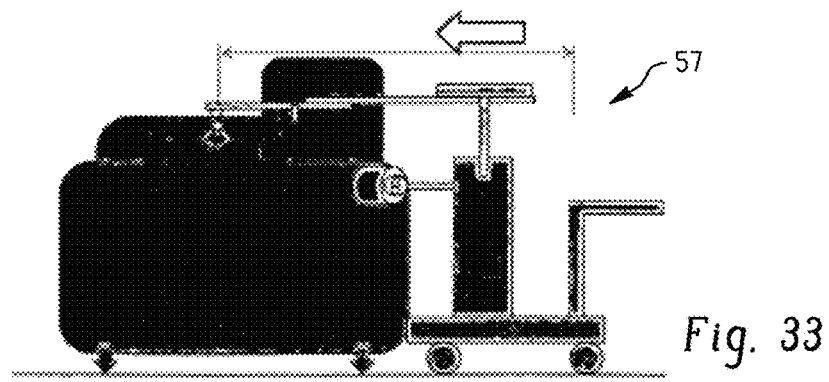

In the next step, when the socket element has been correspondingly locked in the centering element, the receiving device 4 is fully extended. In this case, a height adjustment in the Z direction is not possible since the corresponding mechanism is locked by means of the locking device (step 62; FIG. 33).

Figure 34:
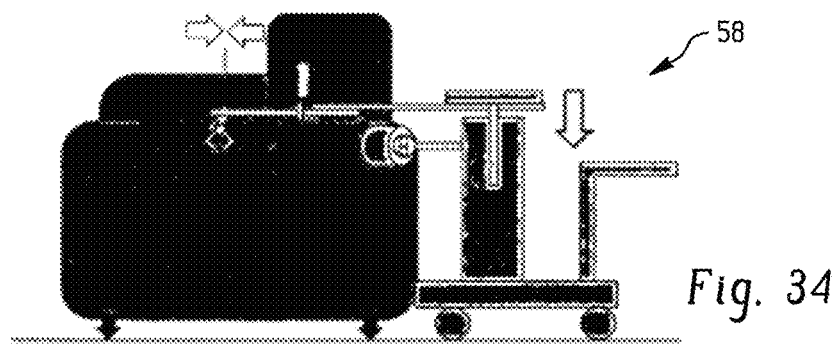

Only if the receiving device 4 is fully extended into the transfer position does the locking device unlock and only then is it possible to lower the receiving device and the interface unit situated thereon or to adjust its height in the Z direction (step 63; FIG. 34).

Figure 35:
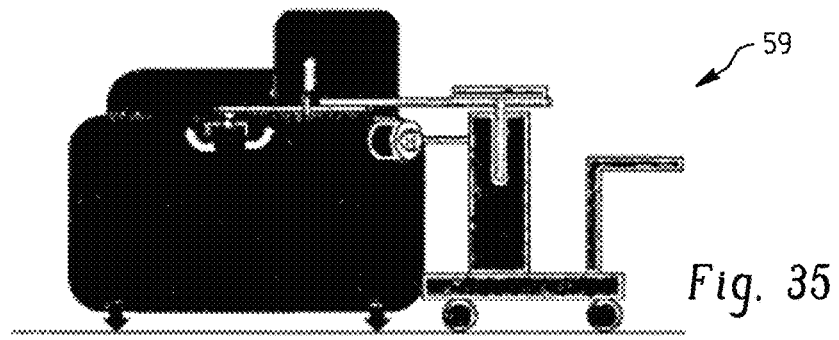

After the receiving device 4 has been lowered all the way, the fixing device is unlocked so that the interface unit is released (step 64; FIG. 35).

Figure 36:
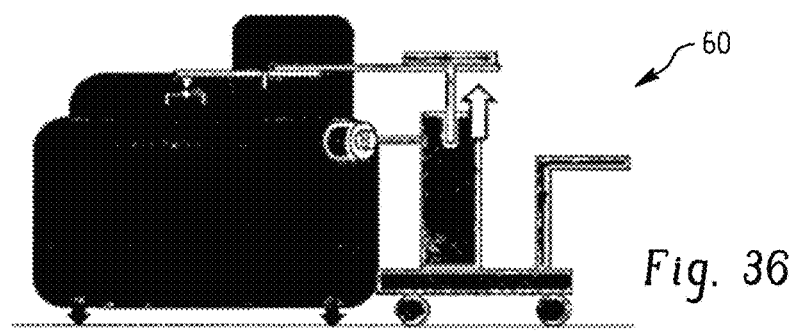

In the next step, a height adjustment or lifting in the Z direction of the fully extended receiving device takes place (step 65; FIG. 36).

Figure 37:
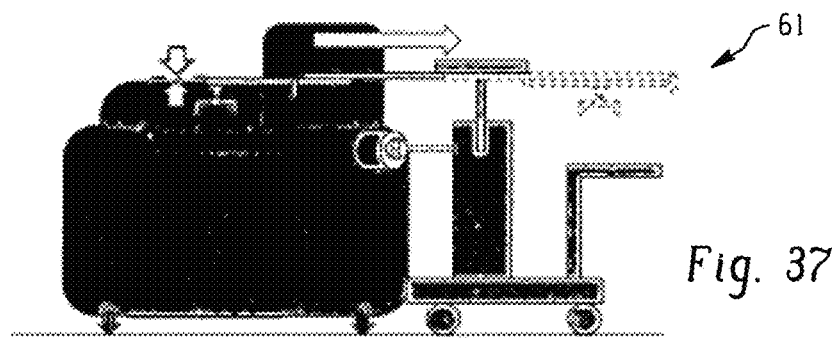

When the receiving device 4 has reached the upper end position, the receiving device is retracted into its travel position (step 66; FIG. 37).

Figure 38:
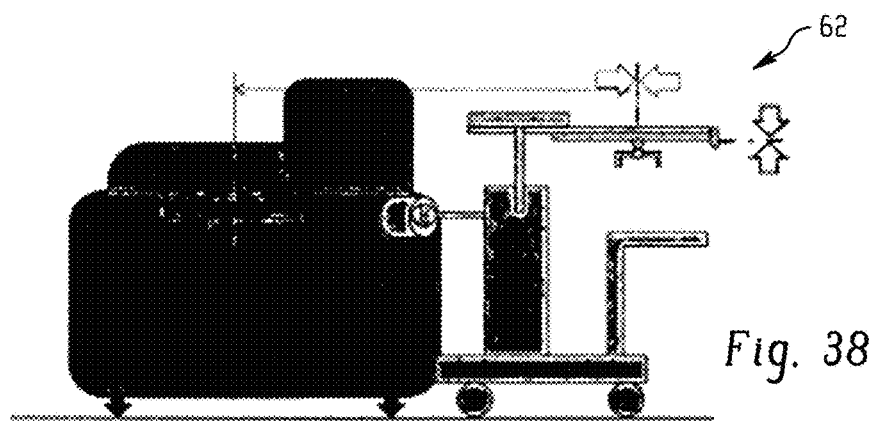

If the receiving device has arrived in its travel position, then the height adjusting device is locked in the Z direction so that it can no longer be moved (step 67; FIG. 38).

In the next step, the centering element 27 is unlocked so that it can be pulled out from the socket element 32 (step 68; FIG. 39).

Then the handling device 1 is released again and can be removed from the prober and moved freely (step 69; FIG. 40).

It has been explained above that the drawer mechanism is moved into a travel position (FIG. 10) and the lift device for raising and lowering the handling unit in the Z direction is locked with the locking device. In this way, the interface unit can be securely moved with the handling device.

In addition, the lift device for raising and lowering the handling unit in the Z direction is embodied such that in a transfer position (FIG. 9) and in a service position (FIG. 8), a movement in the Z direction is possible only if the drawer mechanism has moved all the way into or out of one of the two end positions so that the locking device is unlocked.

This locking device 70 will be described in detail below (FIGS. 41 to 46).

The locking device 70 includes a locking mechanism 71 and an actuating mechanism 72.

One part of the locking mechanism 71 is located on a part of the lift frame unit 20 that is able to move in the Z direction and is connected to the column unit 1. This part of the locking mechanism 71 includes a base element 73 with two tilt levers 74 supported on it in articulated fashion. For actuating the tilt lever 74, an actuating wheel 75 is located on each tilt lever 74. In the central area of the locking mechanism 71, a locking pin 76 extending in the horizontal direction is guided in a socket 77 in movable fashion. The locking pin 76 is coupled to a latch body 90. The locking pin is acted on by a spring 78, which keeps it in an unlocked state. The locking pin can be actuated via the latch body 90, both by the tilt levers 74 and directly. For the direct actuation, two actuating surfaces 105 located in the vertical plane and inclined in relation to the base element 73 are formed onto the latch body 90.

A corresponding receiving element 79 of the locking mechanism 71 is located on a stationary part of the lift frame unit 20 that is connected to the chassis 2. The receiving element 90 has a corresponding sleeve 80 for receiving the locking pin 76.

The actuating mechanism 72 includes two linear guides 81, 82, which embody a mechanical AND element. That means that only when both linear guides 81, 82 release the locking mechanism is the locking pin 67 disengaged from the sleeve 80 by the spring force. Only then is it possible for the receiving device that can be linearly extended and retracted in the horizontal direction to be moved in the Z direction.

The first linear guide 81, on an end located in the vicinity of the receiving unit 5, has an oblique actuating surface 83, along with the actuating wheels located on the tilt levers 74 slide.

The second linear guide 82 is an elongated swiveling lever 82, which has a roller 86, 87 at both ends. The roller 86 located in the vicinity of the receiving unit 5 either releases or blocks the locking pin by means of the actuating surfaces formed onto the latch body. The roller 87 located at the other end cooperates with a triangular actuating element 88, located at the other end, in such a way that the swiveling lever is tilted about a pivot point 89 in accordance with the position of the drawer mechanism.

Because of the mechanical AND linkage of the two linear guides, it is absolutely ensured that the drawer mechanism, in the travel position (FIG. 10), is locked so that no movement is possible in the Z direction and, in the transfer position (FIG. 9) and in the service position (FIG. 8), is unlocked so that a movement in the Z direction is possible.

Thus in a further aspect of the present invention, the mechanical locking device 70 is provided for locking the lift mechanism, which includes the actuating mechanism and the locking mechanism; the actuating mechanism has two actuating elements, which are operatively connected to the locking mechanism in such a way that unlocking the locking mechanism is possible only when the locking mechanism is released by both actuating elements.

In this way, damage to the pins, specifically contact pins, of the interface unit due to incorrect use by a user is precluded.

Another exemplary embodiment of a handling device 1 according to the invention is described below (FIGS. 47 to 55). Unless otherwise described, this handling device 1 has the same features as the handling device described above.

The receiving unit 5 of the handling device 1 is preferably embodied for receiving a test head 91 in order to position it on or in relation to a prober 92.

In this exemplary embodiment, the receiving unit 5 for receiving the test head 91 is connected to the rest of the handling device 1 by means of a swivel mechanism 93 (FIGS. 47 to 50). The swivel mechanism 93 includes a swivel shaft 94, by means of which the receiving unit 5 is connected to the rest of the handling device 1. The swivel mechanism enables a lateral pivoting motion of the receiving unit around a vertical pivot axis by at least 90°.

This handling device 1 also features the fact that two centering elements 27 of the aligning device 6 are located laterally beside the handling device 1, in other words beside the chassis 2, one above the other, aligned in the vertical direction.

Accordingly, lateral to the prober 92, socket elements 32 are likewise located one above the other in the vertical direction.

The aligning device 6 includes an actuating peg 95, which is guided in a corresponding socket 96 on the aligning device 6 and can be actuated by means of an eccentric groove 104 in such a way that by a 90° rotation of the locking lever, tension or compression—depending on the direction of rotation—is exerted on the actuating peg 95 (FIG. 51, 52). The eccentric groove 104 is embodied on the circumference wall of the aligning device 6. The actuating peg 95 is coupled, via corresponding tension/compression cables (not shown), to a securing pin mechanism 97 located in the vicinity of the swivel shaft 94.

The securing mechanism 97 includes a pivot plate 98, which has a pivot point 99 (FIGS. 53 to 55). The tension/compression cable (not shown) and a securing pin 100 are secured to the pivot plate 98. The securing pin 100 is embodied for locking the swivel shaft 94. To that end, a vertically extending latch groove 101 is embodied in the swivel shaft 94.

By means of this kind of handling device 1, it is now possible to place a test head 91 safely and reliably on a prober 92.

To that end, the handling device 1, together with the test head 91, is placed laterally beside the prober 92.

Next, the centering elements 27 of the handling device 1 are inserted into the corresponding socket elements 32 of the prober 92 and, by 90° rotation of the locking lever 29, connected solidly to the prober.

By the 90° rotation of the locking lever 29, the actuating peg 95 is actuated such that the pivot plate 98, connected to the actuating peg by means of at least one tension/compression cable, rotates around the pivot point 99 and disengages the securing pin 100 from the latch groove 101. Thus the receiving unit 5 and a test head 91 placed on it are able to swivel laterally outward.

The securing pin mechanism 97 can be embodied such that by means of a mechanical AND linkage, the securing pin 101 disengages from the latch groove 101 only if both centering elements 27 are placed entirely in the socket elements 32 and are correctly locked by a 90° rotation of the locking lever 29.

To prevent an unintentional disengagement of the securing pin 100 from the latch groove 101, for example due to rotation of the locking lever 29 while the handling device is being moved, an additional securing mechanism 102 is provided (FIG. 52). The securing mechanism 102 particularly includes a securing peg 103, which is positioned in a movable, spring-loaded fashion inside the aligning device 6 in such a way that a rotation of the locking lever is possible only when the securing peg, by means of a corresponding actuation pin (not shown), which is placed in the socket element 32, is rotated back in such a way that a rotation of the locking lever is possible. If the securing peg 103 is not rotated back by a corresponding securing pin placed in the socket element 32, then no rotation of the locking lever 29 and hence no disengagement of the securing pin 101 from the latch groove 101 is possible.

In this exemplary embodiment of the present invention, a handling device for exchanging a prober is thus provided, in which an aligning device 6 includes two centering elements 27 that are located laterally beside the handling device 1 and one above the other in the vertical direction, and a swivel mechanism 93 for lateral outward swiveling of a receiving unit 6 is provided, and a securing pin mechanism is provided that can be locked by means of the centering elements 27; the centering elements 27 are operatively connected to the securing mechanism in such a way that the swivel mechanism 93 is able to swivel only if the centering elements 27 are inserted into corresponding socket elements 32 of the prober and locked.

In this way, the receiving unit and a test head 91 placed on it are safely and effectively prevented from suddenly swiveling outward in the event of careless usage.

Thus in this exemplary embodiment of the handling device, not only is it possible for the handling device to be positioned accurately in relation to a further device, in particular of a prober, but an extremely safe mechanism, which does not permit lateral outward swiveling of the receiving unit 6 unless the handling device 1 is solidly connected to the prober 92, is provided as well.

In a method for placing a test head on a prober with a handling device, the following steps are provided:
- moving the handling device 1 to the prober 92;
- inserting the centering elements 27 of the handling device into corresponding socket elements 32 of the prober 92;
- once the locking levers 29 have fully locked the centering elements 27 in the socket elements 32, unlocking the securing pin mechanism 97 is effected by means of a mechanical AND element in such a way that a swivel mechanism 93 is released;
- lateral outward swiveling of the receiving unit together with the test head by means of the hinge mechanism 93;
- lowering the outward-swiveled receiving unit 6 by means of the lift mechanism 19 and placing the test head 91 on the prober 92.

| Reference Numeral List | |
|---|---|
| 1 | handling device |
| 2 | chassis |
| 3 | handling unit |
| 4 | receiving device that can be linearly extended and retracted in the horizontal direction |
| 5 | receiving unit |
| 6 | aligning device |
| 7 | U-shaped frame |
| 8 | rotatable roller |
| 9 | roller |
| 10 | braking device |
| 11 | column unit |
| 12 | handrail |
| 13 | sliding device |
| 14 | crank element |
| 15 | plate-like connecting element |
| 16 | screw-like interlocking device |
| 17 | hinge mechanism |
| 18 | outer frame unit |
| 19 | lift mechanism |
| 20 | lift frame unit |
| 21 | swiveling lever |
| 22 | guide rail |
| 23 | frame |
| 24 | rubber element |
| 25 | rotatable mount |
| 26 | interlocking device |

-continued

| Reference Numeral List | |
|---|---|
| 27 | centering element |
| 28 | conical section |
| 29 | locking lever |
| 30 | bearing section |
| 31 | bearing bush |
| 32 | socket element |
| 33 | fastening section |
| 34 | centering section |
| 35 | locking and tightening recess |
| 36 | insertion section |
| 37 | locking and tightening section |
| 38 | locking lug |
| 39 | guide arm |
| 40 | guide element |
| 41 | guide wheel |
| 42 | testing device |
| 43 | exchanging table |
| 44 | cylindrical section |
| 45 | insertion rollers |
| H | stroke |
| 46-69 | steps |
| 70 | locking device |
| 71 | locking mechanism |
| 72 | actuating mechanism |
| 73 | base element |
| 74 | tilt lever |
| 75 | actuating wheel |
| 76 | locking pin |
| 77 | socket |
| 78 | spring |
| 79 | receiving element |
| 80 | sleeve |
| 81 | first linear guide |
| 82 | second linear guide |
| 83 | actuating surface |
| 84 | |
| 85 | actuating wheel |
| 86 | roller |
| 87 | roller |
| 88 | actuating element |
| 89 | pivot point |
| 90 | latch body |
| 91 | test head |
| 92 | prober |
| 93 | swivel mechanism |
| 94 | swivel shaft |
| 95 | actuating peg |
| 96 | socket |
| 97 | securing pin mechanism |
| 98 | pivot plate |
| 99 | pivot point |
| 100 | securing pin |
| 101 | detent groove |
| 102 | securing mechanism |
| 103 | securing peg |
| 105 | actuating surface |

The invention claimed is:

1. A handling device for exchanging an interface unit comprising:
a chassis; and
a handling unit that is positioned on the chassis so that it is able to move at least in a vertical Z direction;
wherein the handling unit has a receiving device, which can be linearly extended and retracted in a horizontal direction, for receiving the interface unit, and the handling unit has an aligning device for positionally accurate coupling of the handling unit to another device for receiving at least one interface unit.

2. The handling device according to claim 1, wherein the aligning device includes at least one plug-like centering element, which in particular has a cylindrical or conical mating section and which can be inserted into a socket element situated on another device for receiving at least one interface unit, so that the handling unit is placed at a predetermined distance and/or at a predetermined height in relation to a device for receiving an interface unit.

3. The handling device according to claim 1, wherein the aligning device has a tension element, which enables a locking of the centering element in a socket element of a further device for receiving at least one interface unit.

4. The handling device according to claim 2, wherein the aligning device has a tension element, which enables a locking of the centering element in a socket element of a further device for receiving at least one interface unit.

5. The handling device according to claim 1, wherein a lift mechanism, which is able to extend and retract in linear fashion in the horizontal direction, is provided for raising and lowering the receiving device in the Z direction, and wherein the lift mechanism can be raised and lowered by a predetermined height so that in an end position the lift mechanism assumes a predetermined position for receiving or lowering.

6. The handling device according to claim 4, wherein a lift mechanism, which is able to extend and retract in linear fashion in the horizontal direction, is provided for raising and lowering the receiving device in the Z direction, and wherein the lift mechanism can be raised and lowered by a predetermined height so that in an end position, the lift mechanism assumes a predetermined position for receiving or lowering.

7. The handling device according to claim 1, wherein the handling unit is resiliently supported relative to the chassis in the Z direction in order to compensate for an offset in height between the receiving unit and a device for receiving an interface unit.

8. The handling device according to claim 6, wherein the handling unit is resiliently supported relative to the chassis in the Z direction in order to compensate for an offset in height between the receiving unit and a device for receiving an interface unit.

9. The handling device according to claim 1, wherein the handling unit is connected to the chassis by means of a hinge mechanism, which allows a relative movement in a horizontal plane of the interface unit that is able to extend and retract in linear fashion, and the hinge mechanism has torsion springs that keep the handling unit in a starting position in relation to the chassis.

10. The handling device according to claim 8, wherein the handling unit is connected to the chassis by means of a hinge mechanism, which allows a relative movement in a horizontal plane of the interface unit that is able to extend and retract in linear fashion, and the hinge mechanism has torsion springs that keep the handling unit in a starting position in relation to the chassis.

11. The handling device according to claim 7, wherein a frame and a receiving unit connected to the frame in a drawer mechanism are supported so that they are able to rotate around a horizontal axis, and it is possible to rotate the receiving unit by 180°, and this rotated position is referred to as the service position.

12. The handling device according to claim 10, wherein a frame and a receiving unit connected to the frame in a drawer mechanism are supported so that they are able to rotate around a horizontal axis, and it is possible to rotate the receiving unit by 180°, and this rotated position is referred to as the service position.

13. The handling device according to claim 1, wherein the receiving unit is embodied such that an interface unit can be fixed on the receiving unit.

14. The handling device according to claim 12, wherein the receiving unit is embodied such that an interface unit can be fixed on the receiving unit.

15. The handling device according to claim 1, wherein a sliding device for raising and lowering the handling unit in the Z direction is provided in order to perform a height pre-adjustment of the handling unit in relation to a device for receiving an interface unit, in which the centering element can be inserted into the socket element.

16. The handling device according to claim 14, wherein a sliding device for raising and lowering the handling unit in the Z direction is provided in order to perform a height pre-adjustment of the handling unit in relation to a device for receiving an interface unit, in which the centering element can be inserted into the socket element.

17. The handling device according to claim 1, wherein in a travel position, the receiving device that can be extended and retracted in linear fashion in the horizontal direction is fully inserted and locked so that an interface unit can be moved together with the handling device.

18. The handling device according to claim 16, wherein in a travel position, the receiving device that can be extended and retracted in linear fashion in the horizontal direction is fully inserted and locked so that an interface unit can be moved together with the handling device.

19. The handling device according to claim 1, wherein the hinge mechanism and/or the resilient support and/or the rotatable support and/or the receiving device that can be extended and retracted in linear fashion in the horizontal direction and at least one of the sliding device and the lift mechanism has an interlocking device that can inhibit corresponding degrees of freedom.

20. The handling device according to claim 18, wherein the hinge mechanism and/or the resilient support and/or the rotatable support and/or the receiving device that can be extended and retracted in linear fashion in the horizontal direction and at least one of the sliding device and the lift mechanism has an interlocking device that can inhibit corresponding degrees of freedom.

21. The handling device according to claim 5, wherein a mechanical locking device for locking the lift mechanism is provided, which includes an actuating mechanism and a locking mechanism, and the actuating mechanism has two actuating elements, which are operatively connected to the locking mechanism in such a way that it is possible to unlock the locking mechanism only when both actuating elements release the locking mechanism.

22. The handling device according to claim 20, wherein a mechanical locking device for locking the lift mechanism is provided, which includes an actuating mechanism and a locking mechanism, and the actuating mechanism has two actuating elements, which are operatively connected to the locking mechanism in such a way that it is possible to unlock the locking mechanism only when both actuating elements release the locking mechanism.

23. The handling device for exchanging a prober according to claim 22, wherein an aligning device includes two centering elements, which are placed one above the other laterally beside the handling device in the vertical direction, and a swivel mechanism for laterally swiveling a receiving unit outward is provided, and a securing pin mechanism is provided, which can be locked by means of the centering elements, and the centering elements are operatively connected to the securing mechanism in such a manner that swiveling of the swivel mechanism is possible only when the centering elements are inserted into and locked in corresponding socket elements of the prober.

24. The handling device according to claim 1, wherein the chassis include one or more wheels.

* * * * *